(12) United States Patent
Nakamura

(10) Patent No.: US 10,475,663 B2
(45) Date of Patent: Nov. 12, 2019

(54) SEMICONDUCTOR DEVICE AND METHOD FOR MANUFACTURING SEMICONDUCTOR DEVICE

(71) Applicant: Katsumi Nakamura, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 563 days.

(21) Appl. No.: 14/429,337

(22) PCT Filed: Oct. 2, 2012

(86) PCT No.: PCT/JP2012/075559
§ 371 (c)(1),
(2) Date: Mar. 18, 2015

(87) PCT Pub. No.: WO2014/054121
PCT Pub. Date: Apr. 10, 2014

(65) Prior Publication Data
US 2015/0235866 A1    Aug. 20, 2015

(51) Int. Cl.
*H01L 21/322* (2006.01)
*H01L 29/32* (2006.01)
(Continued)

(52) U.S. Cl.
CPC ........ *H01L 21/3221* (2013.01); *H01L 21/324* (2013.01); *H01L 29/0638* (2013.01);
(Continued)

(58) Field of Classification Search
None
See application file for complete search history.

(56) References Cited

U.S. PATENT DOCUMENTS 4,782,029 A    11/1988   Takemura et al.
5,162,241 A    11/1992   Mori et al.
(Continued)

FOREIGN PATENT DOCUMENTS

CN    101385130 A    3/2009
DE    198 14 115 A1   2/1999
(Continued)

OTHER PUBLICATIONS

An Office Action; "Notification of Reason for Rejection," issued by the Japanese Patent Office dated May 19, 2015, which corresponds to Japanese Patent Application No. 2014-539515 and is related to U.S. Appl. No. 14/429,337; with English language partial translation.

(Continued)

*Primary Examiner* — Julio J Maldonado
*Assistant Examiner* — Stanetta D Isaac
(74) *Attorney, Agent, or Firm* — Studebaker & Brackett PC

(57) ABSTRACT

A semiconductor device of the present invention includes a substrate having a drift layer, metal wiring formed on an upper surface of the substrate, and an electrode formed on a back surface of the substrate, wherein the lifetime of carriers in the drift layer satisfies the following expression 1:

[Expression 1]

$$\tau \geq 1.5 \times 10^{-5} \exp(5.4 \times 10^3 t_{N^-}) \quad \text{expression 1}$$

τ: the lifetime of carriers in the drift layer
$t_{N^-}$: the layer thickness of the drift layer.

3 Claims, 30 Drawing Sheets

(51) Int. Cl.
  H01L 29/40    (2006.01)
  H01L 29/66    (2006.01)
  H01L 29/739   (2006.01)
  H01L 29/861   (2006.01)
  H01L 29/06    (2006.01)
  H01L 21/324   (2006.01)
  H01L 29/08    (2006.01)

(52) U.S. Cl.
  CPC ............ *H01L 29/32* (2013.01); *H01L 29/404* (2013.01); *H01L 29/66325* (2013.01); *H01L 29/66348* (2013.01); *H01L 29/7393* (2013.01); *H01L 29/7397* (2013.01); *H01L 29/8611* (2013.01); *H01L 29/0834* (2013.01)

(56) References Cited

U.S. PATENT DOCUMENTS

| | | |
|---|---|---|
| 5,783,491 A | 7/1998 | Nakamura et al. |
| 6,153,495 A | 11/2000 | Kub et al. |
| 6,194,290 B1 | 2/2001 | Kub et al. |
| 6,229,196 B1 | 5/2001 | Shishido et al. |
| 6,274,892 B1 | 8/2001 | Kub et al. |
| 2002/0000562 A1 | 1/2002 | Carlson et al. |
| 2002/0121661 A1 | 9/2002 | Nakamura |
| 2003/0042537 A1 | 3/2003 | Nakamura et al. |
| 2003/0047778 A1 | 3/2003 | Nakamura et al. |
| 2003/0059630 A1 | 3/2003 | Carlson et al. |
| 2006/0137600 A1* | 6/2006 | Ellison .................... C30B 25/00 117/19 |
| 2009/0267191 A1 | 10/2009 | Minato et al. |
| 2010/0327313 A1 | 12/2010 | Nakamura |
| 2011/0291223 A1 | 12/2011 | Nakamura |
| 2012/0309208 A1 | 12/2012 | Tanida |

FOREIGN PATENT DOCUMENTS

| | | | |
|---|---|---|---|
| JP | S56-83948 A | | 7/1981 |
| JP | S64-027231 A | | 1/1989 |
| JP | H03-222427 A | | 10/1991 |
| JP | H04-218921 A | | 8/1992 |
| JP | H04-262537 A | | 9/1992 |
| JP | H05-136153 A | | 6/1993 |
| JP | H07-038102 A | | 2/1995 |
| JP | H07-263692 A | | 10/1995 |
| JP | 2575545 B2 | | 1/1997 |
| JP | H11-054519 A | | 2/1999 |
| JP | 2001-044206 A | | 2/2001 |
| JP | 2001-085686 A | | 3/2001 |
| JP | 2006-140309 A | | 6/2001 |
| JP | 2002-507058 | | 3/2002 |
| JP | 2004-507881 A | | 3/2004 |
| JP | 2005-322712 A | | 11/2005 |
| JP | 2008-251679 A | | 10/2008 |
| JP | 2009-272314 A | | 11/2009 |
| JP | 2010-283131 A | | 12/2010 |
| JP | 2011-100890 A | | 5/2011 |
| JP | 2011100890 A | * | 5/2011 |
| JP | 2012-009811 A | | 1/2012 |
| KR | 2008-0086911 A | | 9/2008 |
| WO | 99/46809 A1 | | 9/1999 |
| WO | 02/058160 A1 | | 7/2002 |
| WO | 02/061845 A1 | | 8/2002 |
| WO | 2005/108656 A1 | | 11/2005 |
| WO | 2007/096996 A1 | | 8/2007 |
| WO | 2009/122486 A1 | | 10/2009 |
| WO | 2012/063342 A1 | | 5/2012 |

OTHER PUBLICATIONS

Notification of Transmittal of Translation of the International Preliminary Report on Patentability and Translation of Written Opinion of the International Searching Authority; PCT/JP2012/075559; dated Apr. 16, 2015.

International Search Report; PCT/JP2012/075559; dated Dec. 11, 2012.

An Office Action issued by the Korean Patent Office dated Aug. 22, 2016, which corresponds to Korean Patent Application No. 10-2015-7007235 and is related to U.S. Appl. No. 14/429,337; with English language partial translation.

An Office Action; "Notification of Reason for Rejection," issued by the Japanese Patent Office dated Aug. 30, 2016, which corresponds to Japanese Patent Application No. 2015-141375 and is related to U.S. Appl. No. 14/429,337; with English language partial translation.

An Office Action issued by the Chinese Patent Office dated Sep. 12, 2016, which corresponds to Chinese Patent Application No. 201280076231 and is related to U.S. Appl. No. 14/429,337; with English language partial translation.

An Office Action; "Notice of Reasons for Rejection," mailed by the Japanese Patent Office dated Nov. 14, 2017, which corresponds to Japanese Patent Application No. 2016-208383 and is related to U.S. Appl. No. 14/429,337.

An Office Action; "Notification of Reasons for Refusal," issued by the Japanese Patent Office dated Jan. 22, 2019, which corresponds to Japanese Patent Application No. 2018-053758 and is related to U.S. Appl. No. 14/429,337; with English language translation.

An Office Action mailed by the German Patent and Trademark Office dated Dec. 7, 2018, which corresponds to German Patent Application No. 11 2012 006 967.6 and is related to U.S. Appl. No. 14/429,337.

S. M. Sze, "Physics of Semiconductor Devices," 2nd Edition, 1981, p. 35-38, ISBN 0-471-05661-8, A Wiley-Interscience Publication, New York, U.S.A.

JP Office Action dated Jul. 18, 2017, from corresponding JP Appl No. 2016-208383, 8 pages.

An Office Action; "Decision of Final Rejection," issued by the Japanese Patent Office dated Jan. 26, 2016, which corresponds to Japanese Patent Application No. 2014-539515 and is related to U.S. Appl. No. 14/429,337; with English language partial translation.

* cited by examiner

FIG. 20 lifetime of carriers[μs]

|  | After etching on wafer back surface | After annealing step |
|---|---|---|
| Comparative example | 166.0 | 377.3 |
| Embodiment 1 | 170.0 | 718.8 |

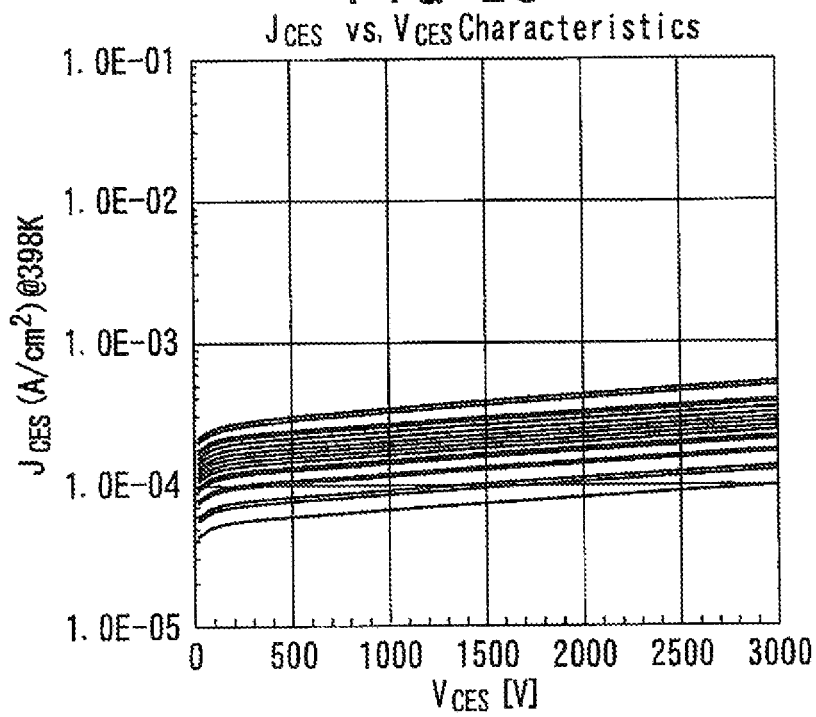
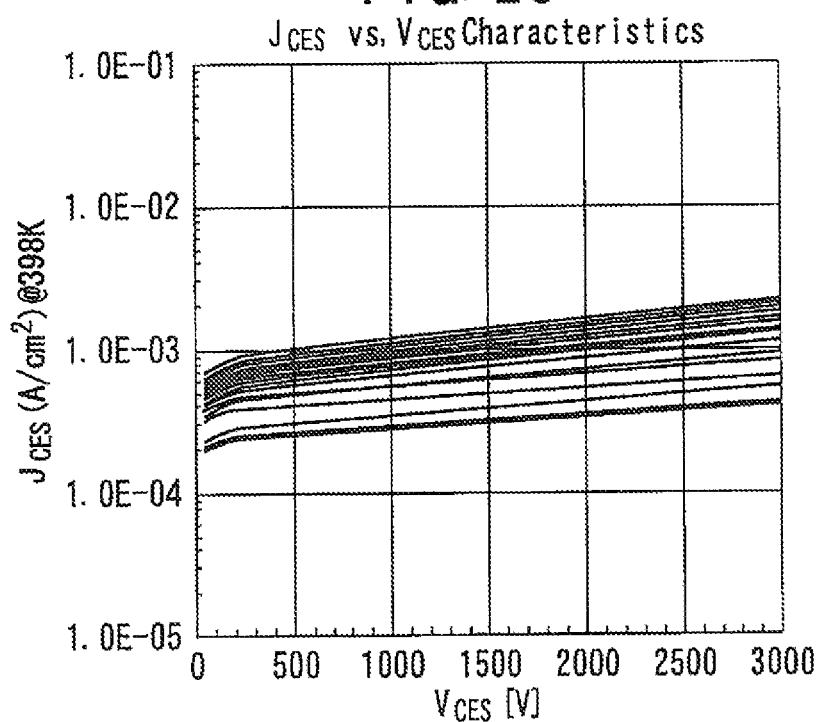

FIG. 30

| | $V_{CE}$ (sat) [V] @$I_C$=33A $V_G$=15V | | $I_{CES}$ [μA] @$V_{CES}$=6500V | | $E_{OFF}$ [mJ/Apulse] @$V_{CC}$=3600V |
|---|---|---|---|---|---|
| | 298K | 398K | 398K | 423K | 398K |
| comparative example | 3.09 ± 0.05 | 3.93 ± 0.09 | 301.5 ± 172.2 | 3120.8 ± 414.1 | 7.380 ± 1.020 |
| additional comparative example | 3.13 ± 0.06 | 3.98 ± 0.13 | 393.2 ± 212.2 | 1850.0 ± 932.6 | 6.447 ± 0.176 |
| embodiment1 | 3.00 ± 0.06 | 3.75 ± 0.09 | 0.9 ± 1.8 | 113.8 ± 40.9 | 6.176 ± 1.177 |

| | After etching on wafer back surface | After annealing step |
|---|---|---|
| Comparative example | 166.0 | 377.3 |
| Embodiment 3 | 165.0 | 720.8 | lifetime[μs]

power density for laser annealing [J/cm²]

US 10,475,663 B2

SEMICONDUCTOR DEVICE AND METHOD FOR MANUFACTURING SEMICONDUCTOR DEVICE

TECHNICAL FIELD

This invention relates to a semiconductor device (e.g., an IGBT or a diode) used, for example, for high-voltage large-current switching and to a method of manufacturing the semiconductor device.

BACKGROUND ART

Patent Literature 1 discloses a method of manufacturing a semiconductor device by adopting a gettering technique. In this gettering technique, a gettering site is first formed in a lower surface of a semiconductor wafer (substrate). Thereafter, a heat treatment is performed on the substrate to capture a metal impurity in the substrate with the gettering site. A contaminated layer which is the gettering site having captured the metal impurity is thereafter removed. In the semiconductor device manufacturing method disclosed in Patent Literature 1, these process steps are repeatedly performed a certain number of times.

PRIOR ART

Patent Literature

Patent Literature 1: Japanese Patent Laid-Open No. H4-218921
Patent Literature 2: Japanese Patent Laid-Open No. H7-263692
Patent Literature 3: International publication No. WO2009-122486
Patent Literature 4: International publication No. WO2002-058160
Patent Literature 5: International publication No. WO2002-061845
Patent Literature 6: Japanese Patent Laid-Open No. 2001-085686
Patent Literature 7: Japanese Patent Laid-Open No. 2010-283131
Patent Literature 8: Japanese Patent Laid-Open No. 2012-9811

SUMMARY OF INVENTION

Technical Problem

In the semiconductor device manufacturing method disclosed in Patent Literature 1, forming of the gettering site, heating of the substrate and removal of the contaminated layer are executed a certain number of times. There is, therefore, a problem of the semiconductor device manufacturing process being complicated.

The semiconductor device manufacturing method disclosed in Patent Literature 1 has the problem that it is not clear under what conditions the gettering technique should be used, since study was not sufficiently made as to how the electrical characteristics of the semiconductor device is influenced by the use of the gettering technique.

The present invention has been achieved to solve the above-described problem, and an object of the present invention is to provide a semiconductor device capable of stabilizing electrical characteristics while removing a metal impurity and other things in a substrate in a simple way and exhibiting the essential performance of the semiconductor device, and a method of manufacturing the semiconductor device.

Means for Solving the Problems

The semiconductor device according to the present invention includes a substrate having a drift layer, metal wiring formed on an upper surface of the substrate, and an electrode formed on a back surface of the substrate, wherein the lifetime of carriers in the drift layer satisfies the following expression 1:

[Expression 1]

$$\tau \geq 1.5 \times 10^{-5} \exp(5.4 \times 10^3 t_{N^-}) \qquad \text{expression 1}$$

$\tau$: the lifetime of carriers in the $N^-$ drift layer[sec]
$t_{N^-}$: the layer thickness of the $N^-$ drift layer[m].

Other features of the present invention will be made clear from the following description.

Advantageous Effects of Invention

According to the present invention, electrical characteristics can be stabilized while a metal impurity and other things in the substrate are removed in a simple way and the essential performance of the semiconductor device is exhibited.

BRIEF DESCRIPTION OF THE DRAWINGS

FIG. 20 is a table showing changes in carrier lifetime with respect to the existence/nonexistence of the gettering layer forming step.

FIG. 28 is a graph of $J_{CES}$-$V_{CES}$ characteristics of a plurality of semiconductor devices manufactured by the semiconductor device manufacturing method according to Embodiment 1 of the present invention.

FIG. 29 is a graph of $J_{CES}$-$V_{CES}$ characteristics of a plurality of semiconductor devices manufactured by the semiconductor device manufacturing method in the comparative example.

FIG. 30 is a table showing the correspondence between electrical characteristics of IGBTs in a 6500 V withstand voltage class and manufacturing methods.

DESCRIPTION OF EMBODIMENTS

Figure 1:
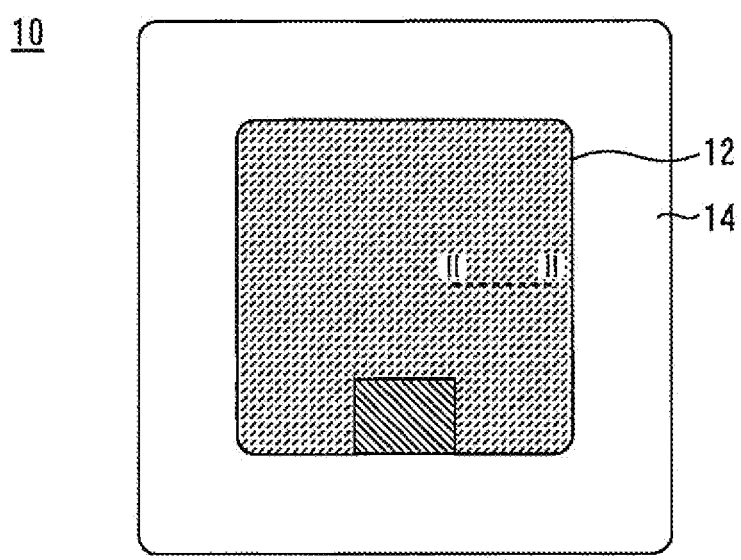
FIG. 1 is a plan view of a semiconductor device according to Embodiment 1 of the present invention.

A semiconductor device and a method of manufacturing the semiconductor device will be described with reference to the drawings. Components identical or corresponding to each other are indicated by the same reference characters and repeated description of them is omitted in some cases.

Embodiment 1

Figure 2:
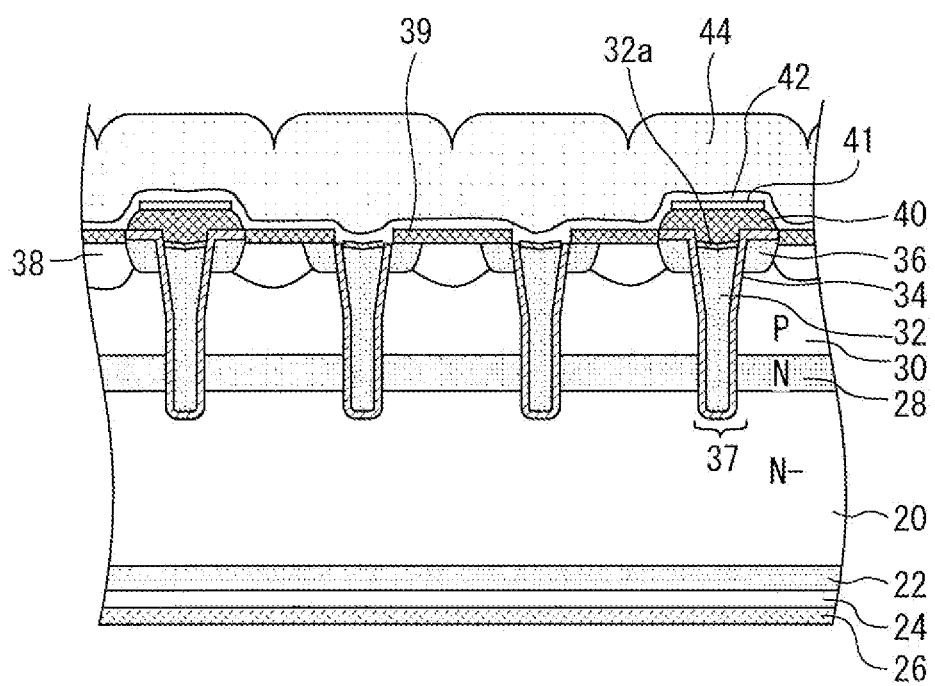
FIG. 2 is sectional view taking along line II-II in FIG. 1.

FIG. 1 is a plan view of a semiconductor device according to Embodiment 1 of the present invention. A semiconductor device 10 has an active region 12 and an edge termination region 14 formed so as to surround the active region 12. FIG. 2 is sectional view taking along line II-II in FIG. 1. An IGBT of a trench structure is formed as the semiconductor device. The semiconductor device has an N⁻ drift layer 20. The N⁻ drift layer 20 has an impurity density in a range from $1.0 \times 10^{12}$ to $1.0 \times 10^{15}$ [cm⁻³] for example.

An N-type buffer layer 22 is formed on a lower surface of the N⁻ drift layer 20. A P-type collector layer 24 is formed on a lower surface of the buffer layer 22. An electrode 26 is formed on a lower surface of the collector layer 24.

An N layer 28 is formed on an upper surface of the N⁻ drift layer 20. The N layer 28 has a peak impurity density in a range from $1.0 \times 10^{15}$ to $1.0 \times 10^{17}$ [cm⁻³] for example, and a depth in a range from 0.5 to 5.0 [μm] for example. A P-type base layer 30 is formed on an upper surface of the N layer 28. The P base layer 30 has a peak impurity density in a range from $1.0 \times 10^{16}$ to $1.0 \times 10^{18}$ [cm⁻³] for example, and is formed so as to have a depth larger than that of an N⁺ emitter layer 36 and smaller than that of the N layer 28. A trench 37 filled with polysilicon 32 is formed through the base layer 30 and the N layer 28 in a vertical direction. The polysilicon 32 is adjacent to the N⁻ drift layer 20, the N layer 28, the base layer 30 and the N⁺ emitter layer 36, with a gate oxide film 34 interposed therebetween.

The N-type N⁺ emitter layer is formed in the base layer 30 on the front surface side so as to contact the gate oxide film 34. The N⁺ emitter layer 36 has a peak impurity density in a range from $1.0 \times 10^{18}$ to $1.0 \times 10^{21}$ [cm$^{-3}$] for example, and a depth in a range from approximately 0.2 to 1.0 [µm]. A P$^+$ layer 38 is formed on the upper surface side of the P base layer 30. The P$^+$ layer 38 has at its surface an impurity density in a range from $1.0 \times 10^{18}$ to $1.0 \times 10^{21}$ [cm$^{-3}$] for example. A silicide film 39 is formed on upper surfaces of the N$^+$ emitter layer 36 and the P$^+$ layer 38 (the N$^+$ emitter layer 36 and the P$^+$ layer 38 referred to as "first diffusion layer" in some places below). A barrier metal 42 is formed on the polysilicon 32, with an oxide film 32a and an oxide film 40 interposed therebetween. Metal wiring 44 is formed so as to contact the silicide film 39.

Figure 3:
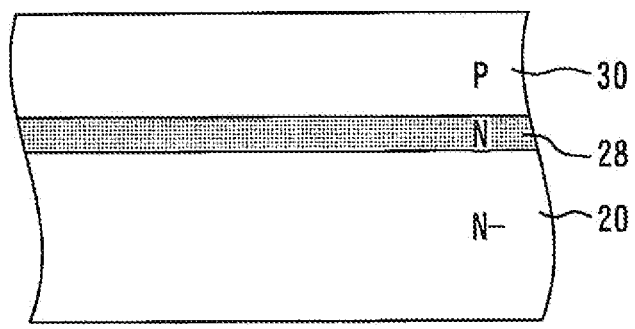
FIG. 3 is a sectional view showing a state where the N layer and the base layer are formed in the substrate in which the N– drift layer is formed.
Figure 4:
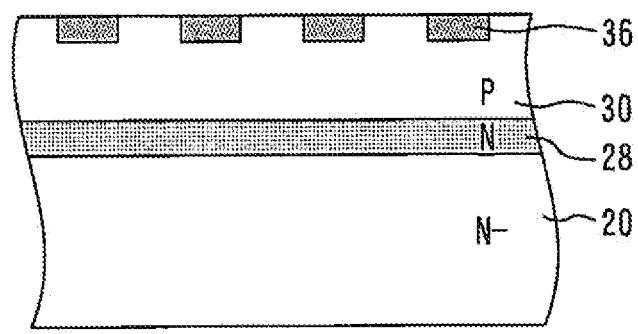
FIG. 4 is a sectional view showing a state after forming emitters.

A method of manufacturing the semiconductor device according to Embodiment 1 of the present invention will be described. First, a silicon wafer formed by an FZ method (which silicon wafer or a processed silicon wafer hereinafter referred to as "substrate") is prepared. FIG. 3 is a sectional view showing a state where the N layer 28 and the P base layer 30 are formed in the substrate in which the N$^-$ drift layer 20 is formed. Ion implantation and annealing are performed on the N$^-$ drift layer 20 to form the N layer 28 and the P base layer 30. The process advances to a subsequent step. FIG. 4 is a sectional view showing a state after forming N$^+$ emitters. Ion implantation and annealing are performed on the substrate to form a plurality of N$^+$ emitter layers 36 on the front surface side of the P base layer 30.

Figure 5:
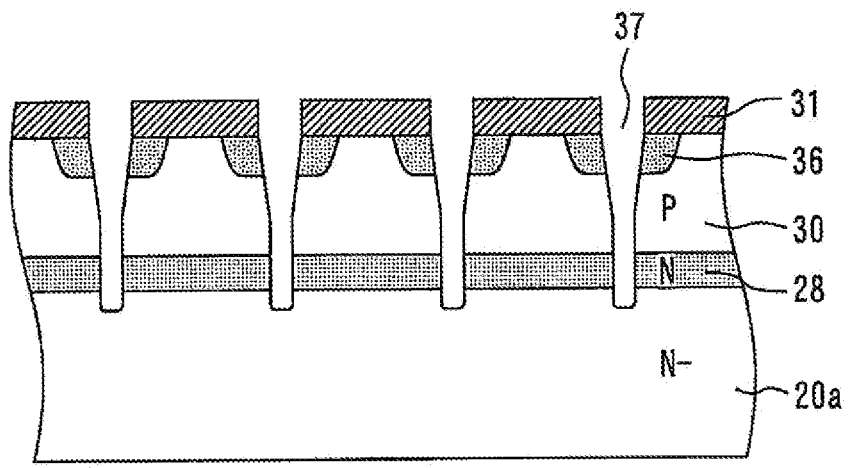
FIG. 5 is a sectional view showing a state where trenches are formed.

The process advances to a subsequent step. FIG. 5 is a sectional view showing a state where trenches are formed. Oxide film 31 is formed on the upper surface of the substrate, followed by patterning using a photoengraving technique. Reactive ion etching using plasma is performed on portions exposed through openings in the oxide film 31 to form trenches 37. Thereafter, chemical dry etching and sacrificial oxidation treatment are performed for the purpose of removing crystal defects and plasma damaged layers in portions around the trenches 37, rounding bottom portions of the trenches 37 and flattening inner walls of the trenches 37. For example, Japanese Patent Laid-Open No. 7-263692 includes a disclosure relating to chemical dry etching and sacrificial oxidation treatment. Also, WO2009-122486 for example includes a disclosure relating to an appropriate depth of trenches 37.

Figure 6:
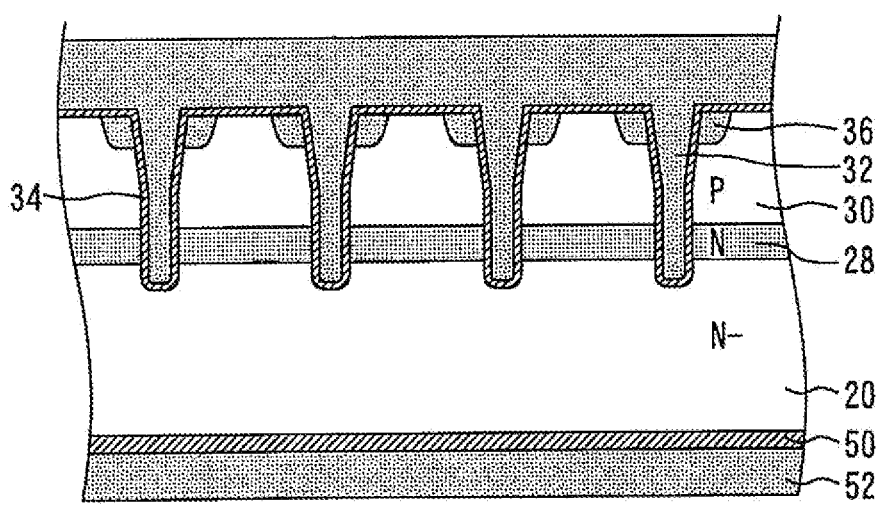
FIG. 6 is a sectional view showing a state where the trenches are filled with polysilicon.

The process advances to a subsequent step. FIG. 6 is a sectional view showing a state where the trenches 37 are filled with polysilicon 32 doped with phosphorus. Gate oxide film 34 is formed on the trench inner walls by thermal oxidation or CVD (see, for example, Japanese Patent Laid-Open No. 2001-085686). Polysilicon 32 doped with phosphorus is formed so as to contact the gate oxide film 34, and fills the trenches. Oxide film 50 is formed in the lower surface of the substrate simultaneously with forming of gate oxide film 34, and polysilicon 52 is formed simultaneously with forming of the polysilicon 32.

Figure 7:
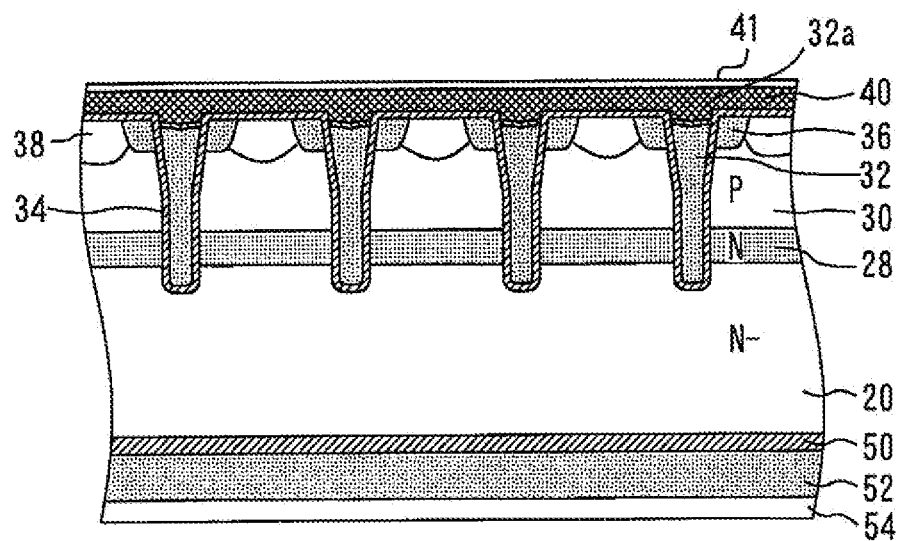
FIG. 7 is a sectional view showing a state where interlayer film is formed by silicate glass or TEOS film.

The process advances to a subsequent step. FIG. 7 is a sectional view showing a state where oxide film 40 and TEOS film 41 are formed. First, the portion of the polysilicon 32 existing outside the trenches 37 is etched. After etching, oxide film 32a is formed by performing thermal oxidation on the polysilicon 32 exposed on the substrate upper surface and the trench 37 filling surfaces or by performing CVD for deposition. Thereafter, the P$^+$ layer 38 is formed in the upper surface of the substrate. Thereafter, oxide film 40 doped with boron or phosphorus and TEOS film 41 are formed by CVD. As oxide film 40, TEOS film or silicate glass may be formed. TEOS film 54 is formed on the lower surface of the substrate simultaneously with forming of the oxide film 40 and TEOS film 41.

Figure 8:
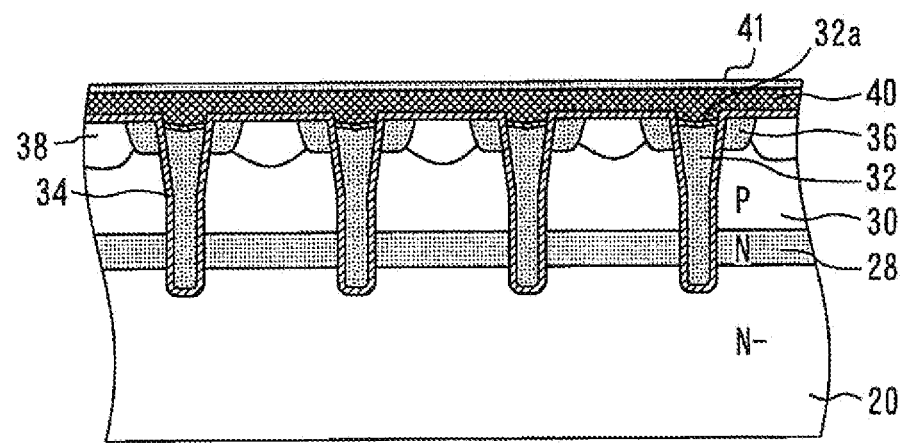
FIG. 8 is a sectional view showing a state where the N– drift layer in the substrate lower surface is exposed.

The process advances to a subsequent step. FIG. 8 is a sectional view showing a state where the N$^-$ drift layer 20 in the substrate lower surface is exposed. The TEOS film 54, polysilicon 52 and oxide film 50 on the lower surface of the substrate are etched by using a solution containing fluoric acid or a mixture acid (e.g., a mixture solution of fluoric acid, nitric acid and acetic acid), thereby exposing the N$^-$ drift layer 20. The preceding process steps including this are referred to collectively as a manufacturing step.

Figure 9:
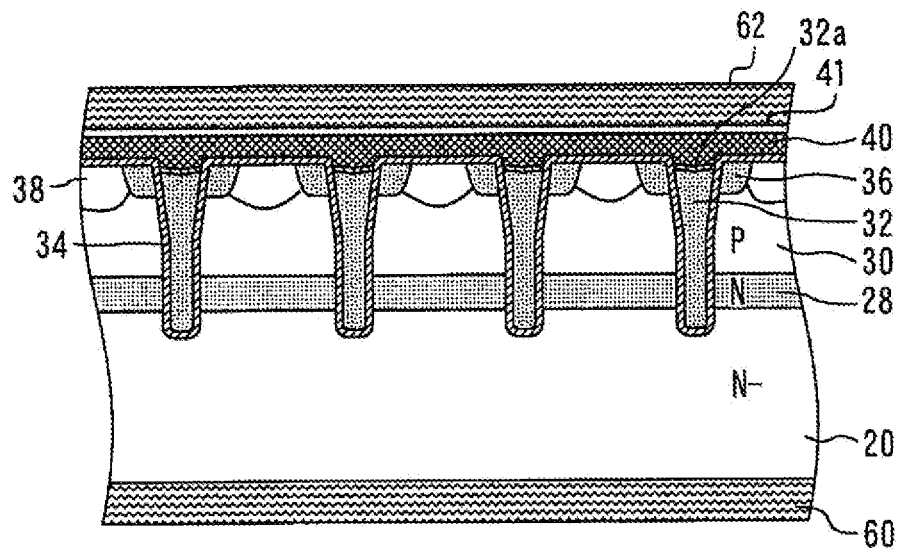
FIG. 9 is a sectional view showing a state where polysilicons doped with an phosphorous are formed.

The process advances to a subsequent step. FIG. 9 is a sectional view showing a state where polysilicons 60 and 62 doped with an impurity are formed. The polysilicon 60 doped with an impurity (Polysilicon doped with an impurity hereinafter referred to as doped polysilicon) is formed so as to contact the N$^-$ drift layer 20 exposed at the lower surface of the substrate. Simultaneously, doped polysilicon 62 not needed is also formed on the substrate upper surface. The doped polysilicons 60 and 62 are formed by LPCVD. As an impurity for doping of the doped polysilicons 60 and 62, phosphorus, arsenic or antimony for example is used in order that the doped polysilicons 60 and 62 be N$^+$ layers. The impurity density in the doped polysilicons 60 and 62 is equal to or higher than $1 \times 10^{19}$ [cm$^{-3}$]. The film thicknesses of the doped polysilicons 60 and 62 are equal to or larger than 500 [nm].

Figure 10:
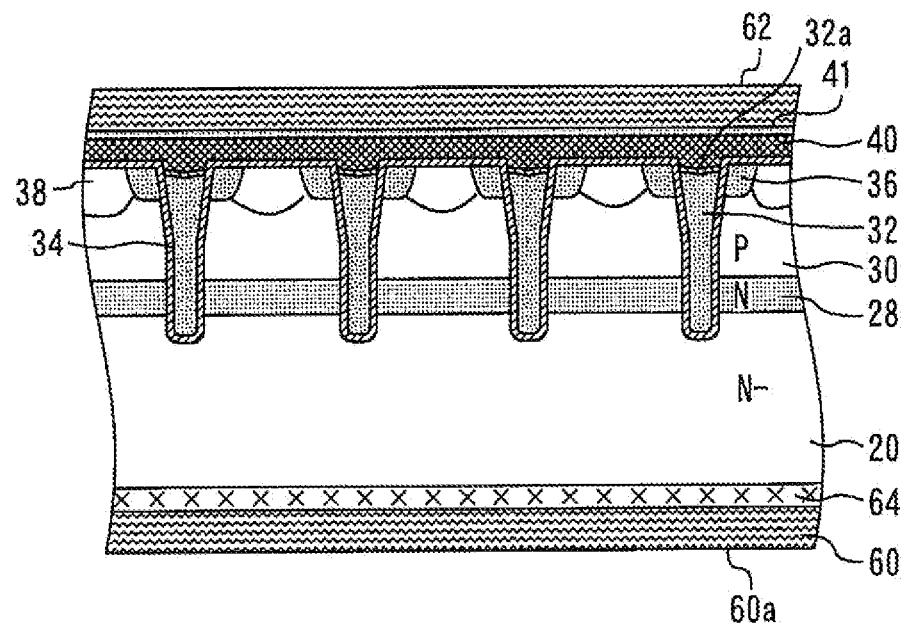
FIG. 10 is a sectional view showing a state where a gettering layer of IGBT is formed.

The process advances to a subsequent step. FIG. 10 is a sectional view showing a state where a gettering layer 64 is formed. The substrate is heated in a nitrogen atmosphere to increase the temperature of the substrate to a point in a range from 900 to 1000[° C.], thereby diffusing the impurity in the doped polysilicon 60 to the lower surface side of the N$^-$ drift layer 20. By this diffusion, the gettering layer 64 having crystal defects and the high-density impurity is formed on the lower surface side of the N$^-$ drift layer 20. This process step is referred to as a preprocessing annealing step. Also, the step to form doped polysilicon 60 and the preprocessing annealing step are referred to collectively as a gettering layer forming step. That is, the gettering layer forming step is a step to form the gettering layer 64 in a lower surface side portion of the N$^-$ drift layer 20 exposed at the lower surface of the substrate. The surface impurity density in the gettering layer 64 is in a range from $1.0 \times 10^{19}$ to $1.0 \times 10^{22}$ [cm$^{-3}$] for example.

After the gettering layer forming step, the temperature of the substrate is reduced at an arbitrary temperature reducing rate to a point in a range from 600 to 700[° C.] and this reduced temperature is maintained for four hours or longer. This step is referred to as an annealing step. In the annealing step, the substrate is heated to diffuse and capture by the gettering layer 64 the metal impurity, contaminant atoms and damage introduced in the N$^-$ drift layer 20 in the manufacturing step.

Figure 11:
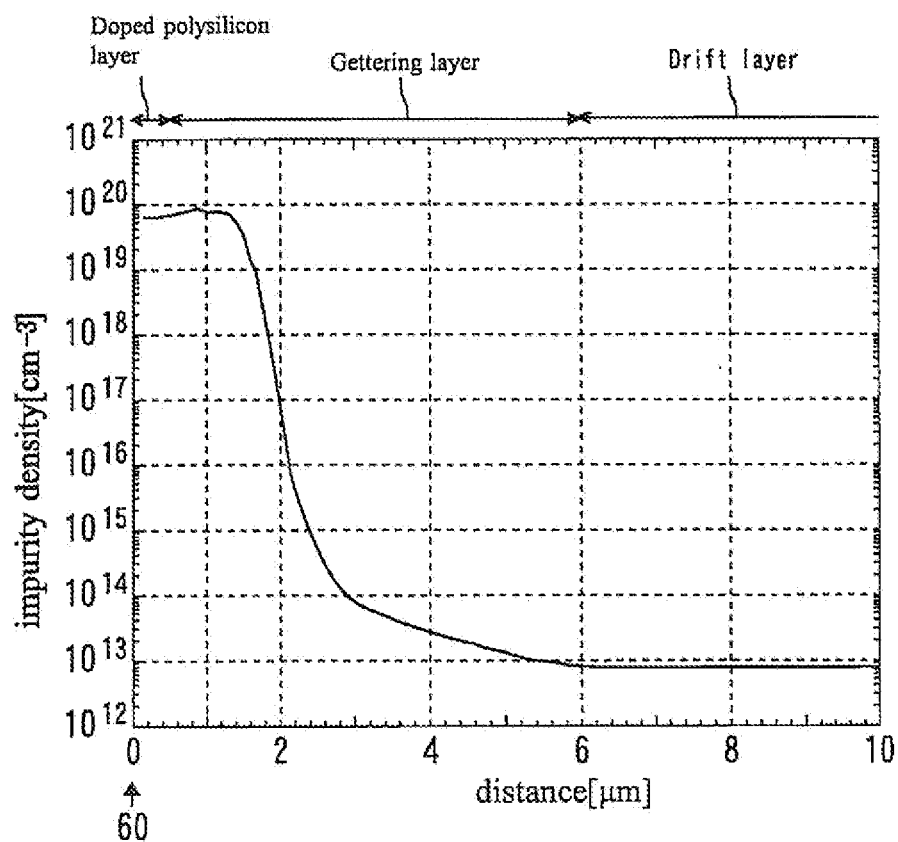
FIG. 11 is a graph showing the impurity concentration in the substrate after the preprocessing annealing step for IGBT.

FIG. 11 is a graph showing the impurity concentration in the substrate after the preprocessing annealing step and the annealing step. The impurity is diffused from the doped polysilicon 60 into the N$^-$ drift layer 20 and the gettering layer 64 having a higher impurity density than that in the N$^-$ drift layer 20 is formed. The maximum value of the impurity density in the gettering layer 64 is about $1 \times 10^{20}$ [cm$^{-3}$].

Figure 12:
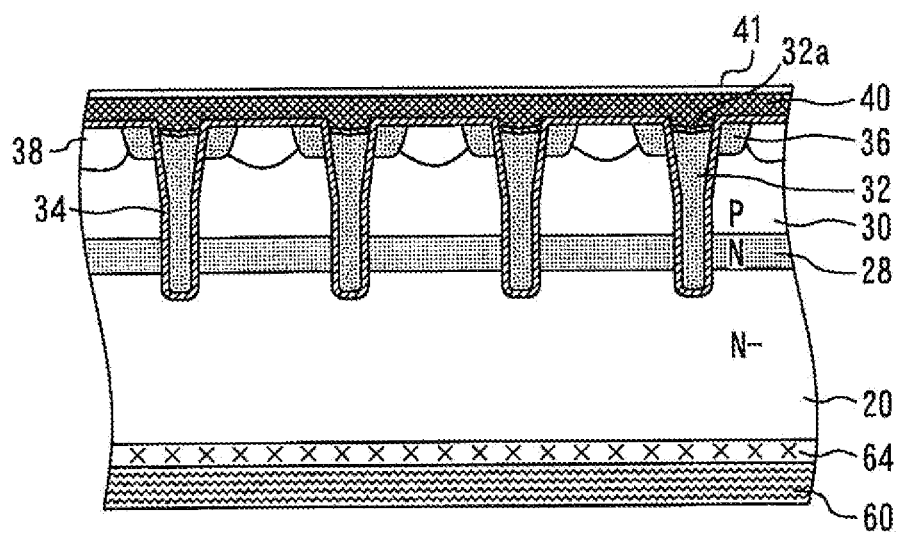
FIG. 12 is a sectional view showing a state after the doped polysilicon on the substrate upper surface of IGBT has been removed.
Figure 13:
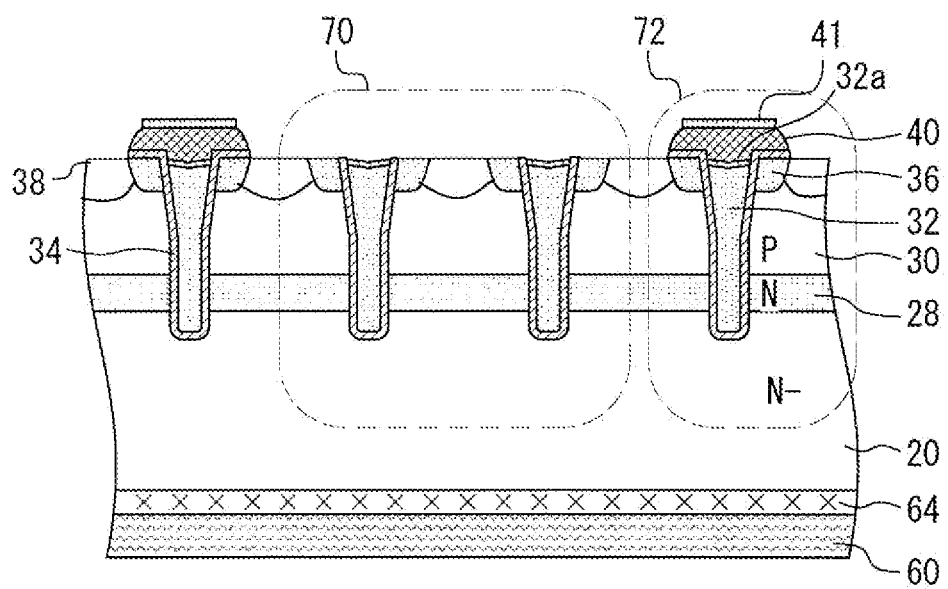
FIG. 13 is a sectional view showing a state where a contact hole of IGBT is formed.

The process advances to a subsequent step. FIG. 12 is a sectional view showing a state after the doped polysilicon 62 on the substrate upper surface has been removed. The doped polysilicon on the substrate upper surface (doped polysilicon 62 in FIG. 10) is selectively removed by using a solution of fluoric acid or a mixture acid (e.g., an fluoric acid/nitric acid/acetic acid mixture solution). The process advances to a subsequent step. FIG. 13 is a sectional view showing a state where a contact hole is formed. The oxide film 40 and TEOS film 41 on the upper surface side of the substrate are partially etched to expose a portion of the first diffusion layer, thereby forming a trench exposed portion 70 having a contact hole. Portions other than the trench exposed portion 70 are MOS Tr portions 72.

The objective to be attained by partially forming a contact hole in the region where the trenches 37 filled with polysilicon 32, as shown in FIG. 13, is to reduce the effective gate width and adjust the capacity by setting part of the polysilicon 32 to the emitter potential. This enables reducing saturated current density, suppressing oscillation at the time of short circuit by capacity control, improving the short circuit capacity (see WO2002-058160 and WO2002-061845 for detailed information) and reducing the on voltage by improving the emitter-side carrier concentration in the on state.

Figure 14:
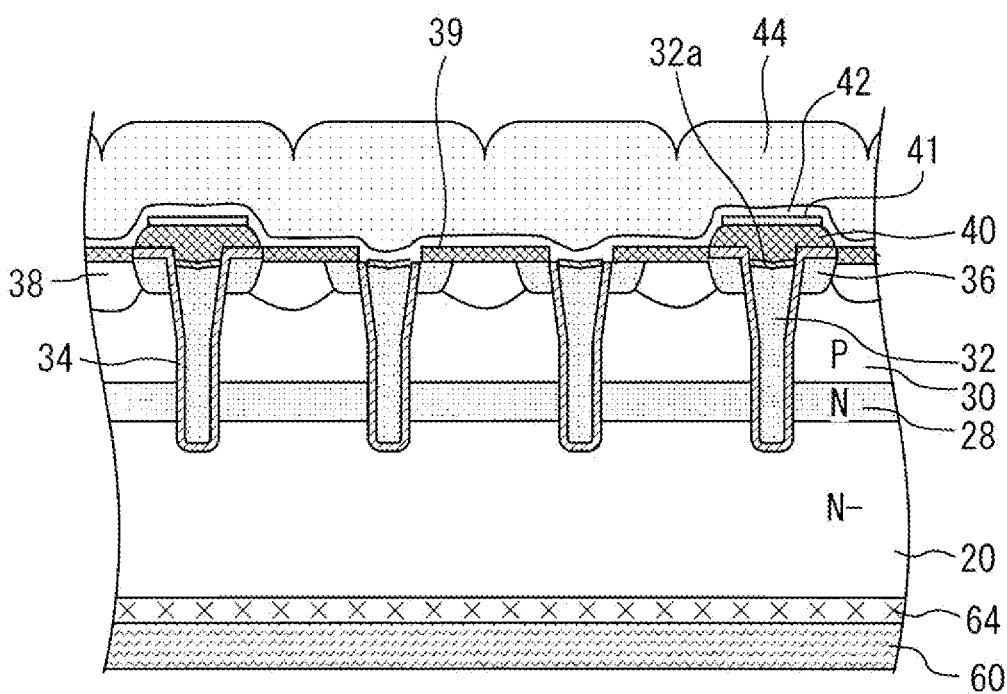
FIG. 14 is a sectional view showing a state where members including a silicide film of IGBT are formed.

The process advances to a subsequent step. FIG. 14 is a sectional view showing a state where members including a silicide film are formed. Silicide film 39 and barrier metal 42 are formed on the substrate upper surface by sputtering and annealing. As a metal at the time of sputtering, a high-melting-point metal material such as Ti, Pt, Co or W is used. Metal wiring 44 having approximately 1 to 3% of Si added thereto is subsequently formed by sputtering on the substrate upper surface. The material of the metal wiring 44 is, for example, AlSi, AlSiCu or AlCu. The metal wiring 44 is electrically connected to the first diffusion layer through the contact hole. A passivation film subsequently formed in an edge termination region.

Figure 15:
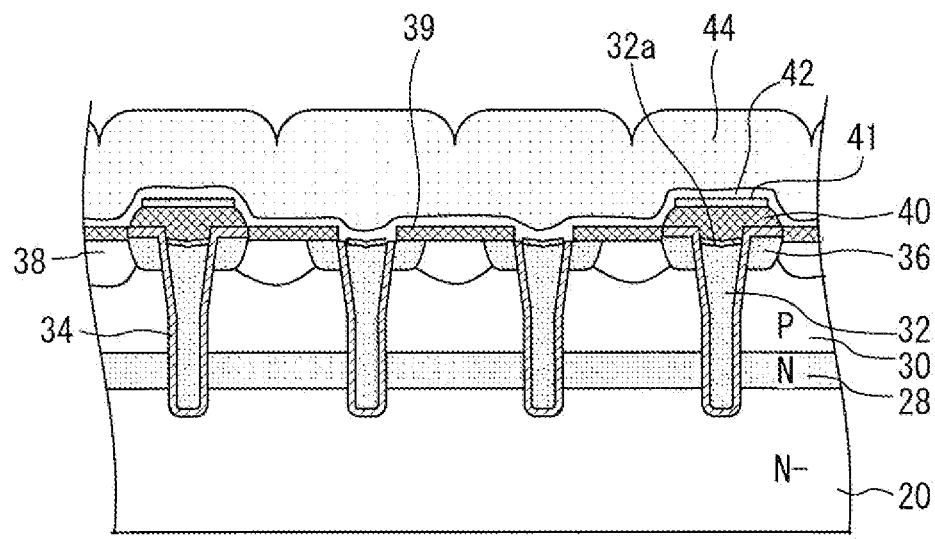
FIG. 15 is a sectional view showing a state after the gettering layer and the doped polysilicon of IGBT have been removed.

The process advances to a subsequent step. FIG. 15 is a sectional view showing a state after the gettering layer and the doped polysilicon have been removed. The gettering layer 64 and the doped polysilicon 60 formed on the lower surface side of the substrate are removed by polishing or etching. The process step to remove a portion including the gettering layer in such a way is referred to as a removal step. In the removal step, a portion of the N⁻ drift layer 20 adjacent to the gettering layer may be removed by a desired thickness. The thickness of the substrate (N⁻ drift layer 20) can thereby be set to a value according to the withstand voltage class of the semiconductor device.

Figure 16:
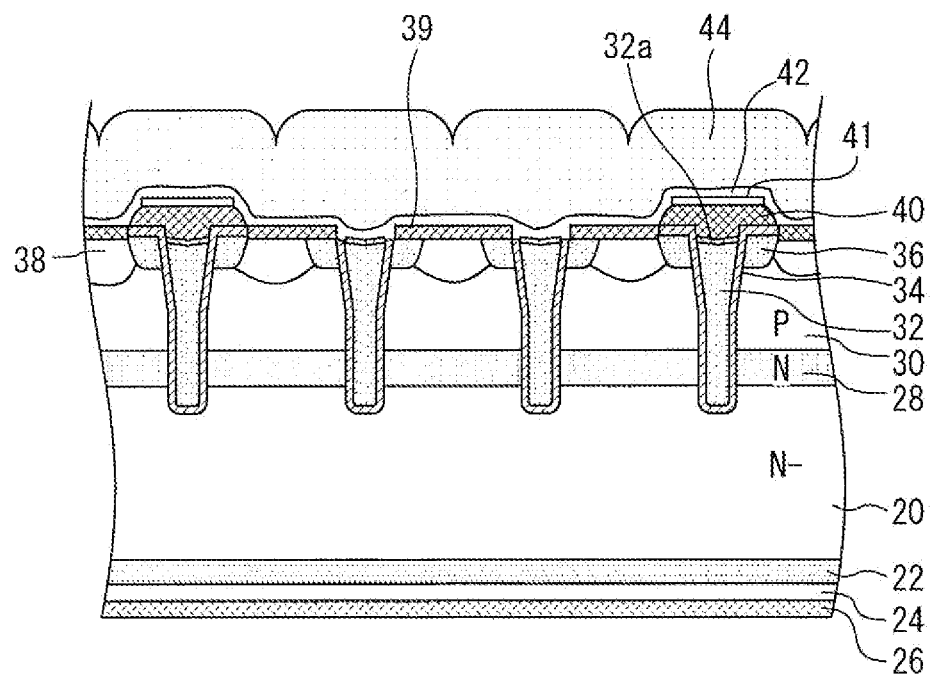
FIG. 16 is a sectional view showing a state where the buffer layer, the collector layer and the electrode of IGBT are formed.

The process advances to a subsequent step. FIG. 16 is a sectional view showing a state where the buffer layer 22, the collector layer 24 and the electrode 26 of IGBT are formed. The buffer layer 22 is formed in the lower surface of the substrate. The P-type collector layer 24 is formed on the lower surface of the buffer layer 22. The electrode 26 is formed on the lower surface of the collector layer 24. The buffer layer 22 and the collector layer 24, which are diffusion layers formed on the lower surface side of the N⁻ drift layer 20, are referred to as a second diffusion layer. Finally, the electrode 26 is formed so as to contact the collector layer 24, which is a portion of the second diffusion layer. The electrode 26 is a portion to be joined by soldering to a circuit board or the like in a module when the semiconductor device is incorporated in the module. It is, therefore, preferable that the electrode 26 be formed by stacking a plurality of metal layers to obtain a low contact resistance.

In the semiconductor device manufacturing method according to Embodiment 1 of the present invention, the annealing step is executed after forming the gettering layer 64. A metal impurity, contaminant atoms and damage introduced in the N⁻ drift layer 20 in the manufacturing step including forming the first diffusion layer on the upper surface side of the substrate, film forming and etching are captured by the gettering layer 64 in the annealing step. The damage referred to here includes disorder in Si crystals due to thermal stress at the time of thermal annealing and damage to Si crystals due to plasma in the plasma etching step. The impurity and crystal defects in the gettering layer 64 form getter sites.

Crystal defects in the gettering layer 64 include high-density dislocations and lattice defects, which capture a metal impurity such as a heavy metal and contaminant atoms. Also, due to the difference in thermal expansion coefficient between the doped polysilicon 60 used to form the gettering layer 64 and the N⁻ drift layer 20, strain is caused at a surface at which the doped polysilicon 60 and the N⁻ drift layer 20 contact each other. This strain also functions as a getter site. By these effects, the carrier lifetime of the N⁻ drift layer 20 reduced due to external factors, the annealing step and the plasma etching step in the manufacturing step can be recovered.

Figure 17:
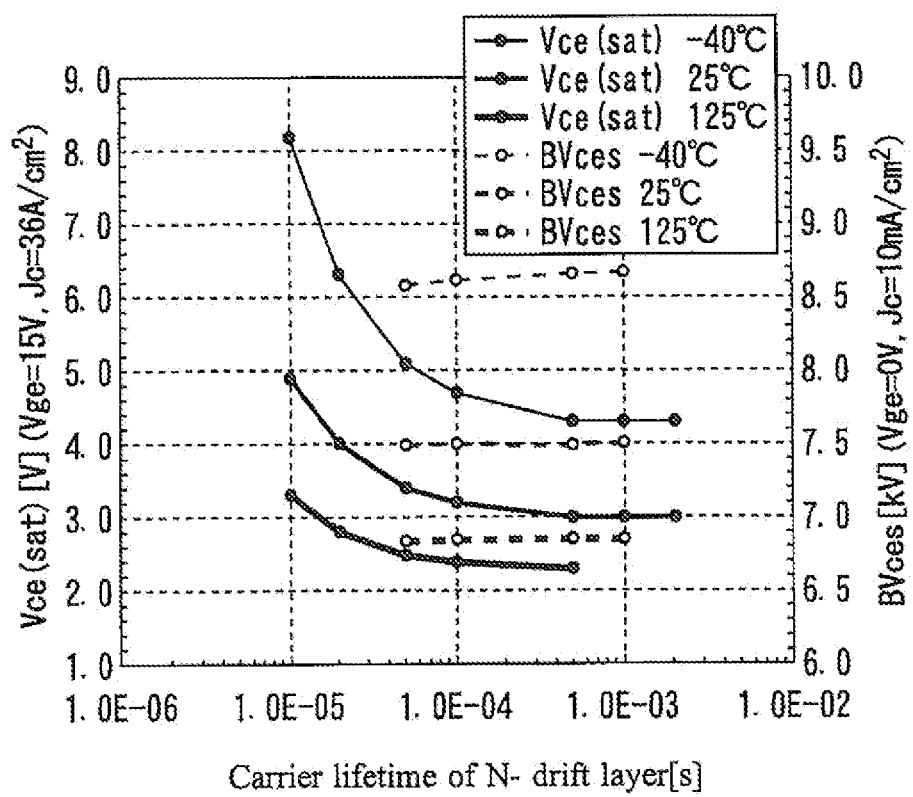
FIG. 17 is a graph showing the relationship between the on voltage ($V_{CE}$(sat)) and the withstand voltage ($BV_{CES}$) of an IGBT and the carrier lifetime of the N− drift layer.
Figure 18:
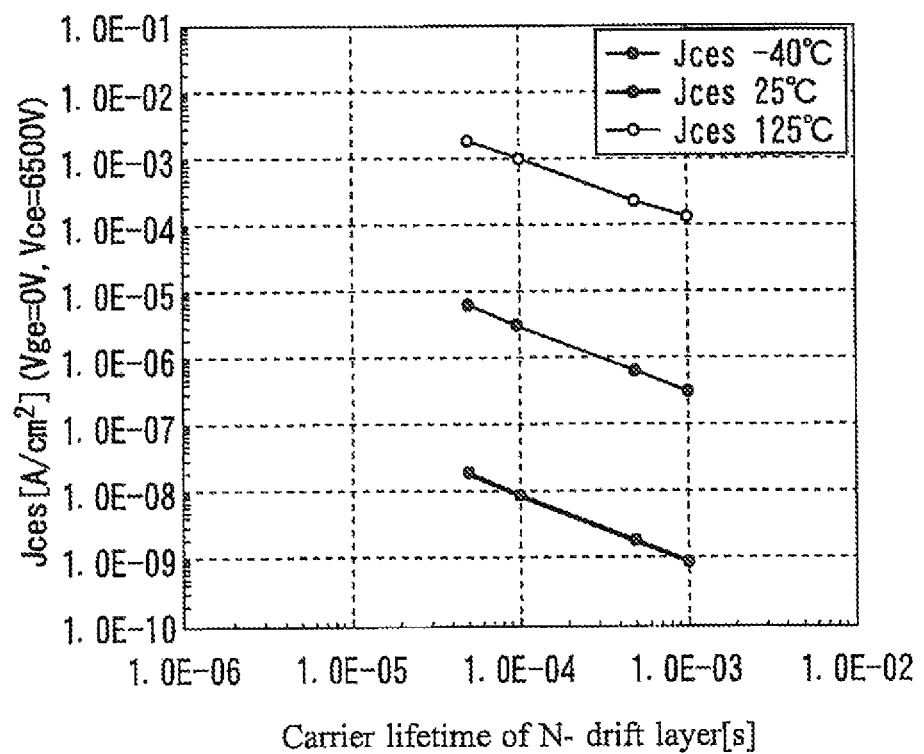
FIG. 18 is a graph showing the relationship between a main junction leak current ($J_{CES}$) and the carrier lifetime of the N− drift layer.

A discussion will be subsequently made of to which extent it is preferable to extend the carrier lifetime in order to stabilize electrical characteristics (hereinafter referred to simply as characteristics) of the semiconductor device. FIG. 17 is a graph showing the relationship between the on voltage ($V_{CE}$(sat)) and the withstand voltage ($BV_{CES}$) of an IGBT and the carrier lifetime of the N⁻ drift layer 20. FIG. 18 is a graph showing the relationship between a main junction leak current ($J_{CES}$) and the carrier lifetime of the N⁻ drift layer. FIGS. 17 and 18 show the results of a simulation with respect to an IGBT in a 6500 V withstand voltage class in which the layer thickness of the N⁻ drift layer 20 is 650 [μm].

As can be understood from FIG. 17, $V_{CE}$(sat) can be stabilized with respect to some variation in the carrier lifetime if the carrier lifetime is equal to or longer than 5.0E-04 [s]. The value of $BV_{CES}$ is substantially independent of the carrier lifetime. As can be understood from FIG. 18, $J_{CES}$ can be reduced if the carrier lifetime is increased. Reducing $J_{CES}$ is effective in inhibiting thermal runaway at temperatures equal to or higher than 398K for example. As a result, the carrier lifetime dependence of $V_{CE}$(sat) can be reduced if the carrier lifetime of the N⁻ drift layer 20 is set generally equal to or longer than 5.0E-04 [s]. $J_{CES}$ can also be reduced thereby.

Figure 19:
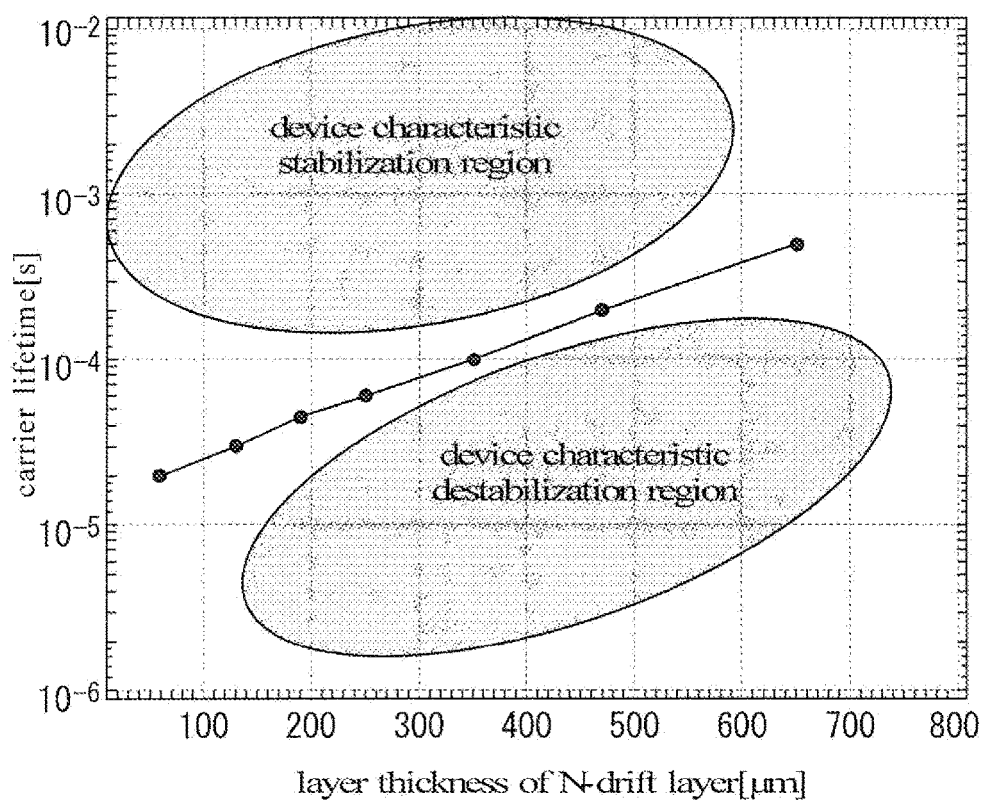
FIG. 19 is a diagram showing carrier lifetime necessary for stabilizing device characteristics.

The above-described simulation was performed on a plurality of IGBTs having various withstand voltage classes in a withstand voltage range from 600 to 6500 V. That is, since the layer thickness of the N⁻ drift layer is, for example, 60 [μm] in the case of the 600[V] withstand voltage class, and 6500 [μm] in the case of the 6500[V] withstand voltage class, the simulation was performed by changing the layer thickness of the N⁻ drift layer in the range from 60 to 6500 [μm]. The carrier lifetime with which the carrier lifetime dependence of $V_{CE}$(sat) can be reduced was calculated with respect to each of values of the layer thickness of the N⁻ drift layer. FIG. 19 is a graph in which the carrier lifetime with which the carrier lifetime dependence of $V_{CE}$(sat) can be reduced was plotted. For example, when the layer thickness of the N⁻ drift layer is 400 [μm], $V_{CE}$(sat) can be stabilized by setting the carrier lifetime to $1.1 \times 10^{-4}$ [sec] or larger. The lifetime of carriers in a "device characteristics stabilization region" in FIG. 19 satisfies equation 2 shown below.

[Expression 2]

$$\tau \geq 1.5 \times 10^{-5} \exp(5.4 \times 10^{3} t_{N^-}) \qquad \text{expression 2}$$

τ: the lifetime of carriers in the drift layer[sec]
$t_{N^-}$: the layer thickness of the drift layer[m]

In FIG. 19, expression 2 is indicated by a straight line. By securing a carrier lifetime longer than the carrier lifetime specified with this straight line, the carrier lifetime dependence of $V_{CE}$(sat) can be reduced to stabilize the device characteristics. In the case of a carrier lifetime shorter than the carrier lifetime specified with this straight line, the carrier lifetime dependence of $V_{CE}$(sat) cannot be reduced. A region corresponding to this is referred to as a device characteristics destabilization region. The lifetime of carriers in the N⁻ drift layer 20 according to Embodiment 1 of the prevent invention is set so as to satisfy expression 2 and belong to the device characteristics stabilization region. Thus, the semiconductor device manufacturing method according to Embodiment 1 of the prevent invention enables reducing carrier lifetime-dependent variation in characteristics of the semiconductor device.

FIG. 20 is a table showing changes in carrier lifetime with respect to the existence/nonexistence of the gettering layer forming step. A comparative example cited in FIG. 20 differs from the semiconductor device according to Embodiment 1 of the prevent invention only in that forming of doped polysilicons 60 and 62 in the step shown in FIGS. 8 to 10 is omitted (the same applies in the following description). There are no differences between details of the process in the comparative example and details of the process in Embodiment 1 of the present invention from the beginning to "etching on the wafer lower surface" corresponding to the step shown in FIG. 8. Therefore, the carrier lifetime in the comparative example and the carrier lifetime in Embodiment 1 of the present invention "after etching on the wafer lower surface" are substantially equal to each other. However, the carrier lifetime is markedly improved after the annealing step in Embodiment 1 of the present invention, while any significant improvement effect is not observed in the comparative example. As a result, it can be understood that the carrier lifetime can be improved by gettering with the gettering layer.

Figure 21:
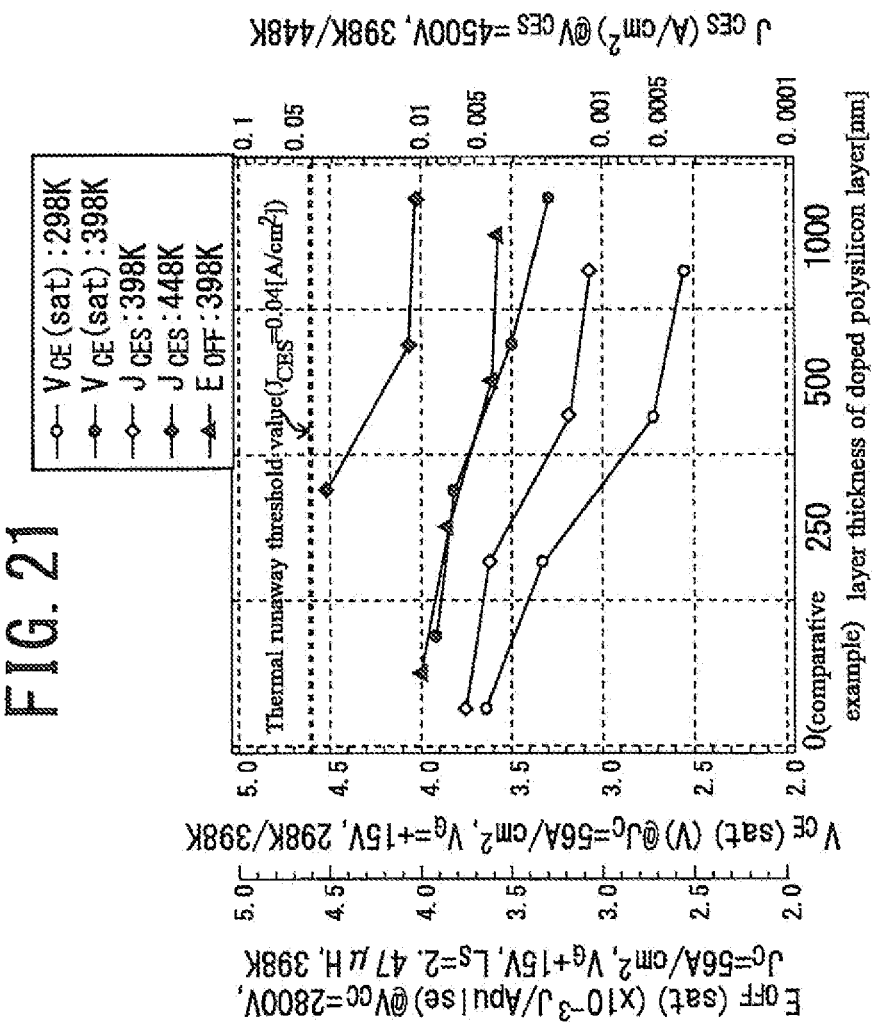
FIG. 21 is a graph showing P-doped polysilicon layer thickness dependences of on voltage ($V_{CE}$(sat)), main junction leak current ($J_{CES}$) and a loss at the time of turnoff ($E_{OFF}$(sat)).
Figure 22:
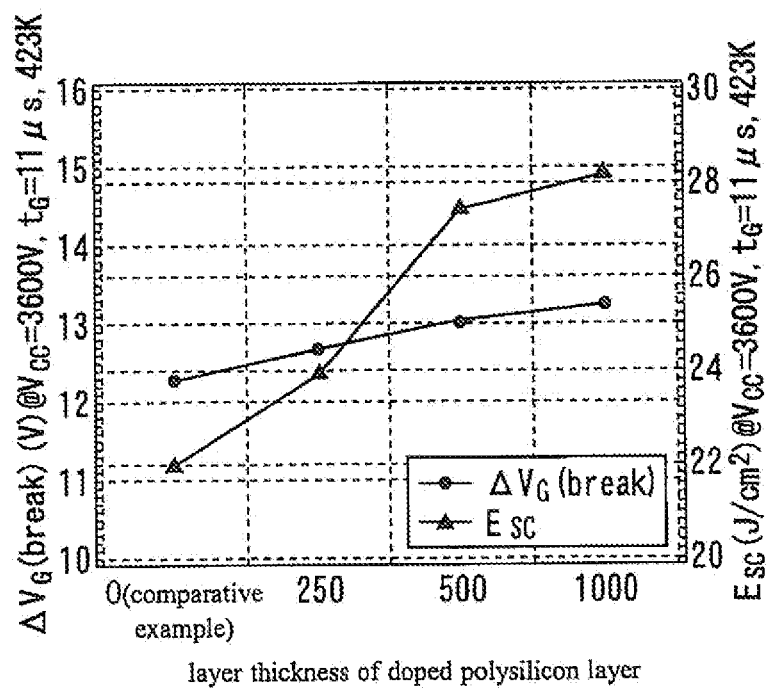
FIG. 22 is a graph showing P-doped polysilicon layer thickness dependences of ΔVg(break), which is the result of subtraction of the threshold voltage(Vth) from the maximum gate voltage necessary for breaking the short circuit state of the IGBT, and the maximum breaking energy ($E_{SC}$) at the time of short circuit.

FIG. 21 is a graph showing doped polysilicon layer thickness dependences of $V_{CE}$(sat), $J_{CES}$ and a loss at the time of turnoff ($E_{OFF}$(sat)). FIG. 22 is a graph showing doped polysilicon layer thickness dependences of $\Delta Vg$ (break), which is the result of subtraction of the threshold voltage from the maximum gate voltage necessary for breaking the short circuit state of the IGBT, and the maximum breaking energy $E_{SC}$ at the time of short circuit. $\Delta Vg$(break) is calculated by "Vg(break)–$V_{GE}$(th)". Vg(break) is the value of the maximum gate voltage (Vg) necessary for breaking the short circuit state, and $V_{GE}$(th) is the gat voltage (threshold voltage) necessary for forming the channel in the MOS channel portion of the IGBT. The data shown in FIGS. 21 and 22 was obtained with respect to an IGBT in which the impurity density of doped polysilicon is equal to or higher than $1.0 \times 10^{19}$ [cm⁻³], and which is in a 4500 V withstand voltage class.

From FIGS. 21 and 22, it can be understood that improved characteristics can be obtained if the thickness of doped polysilicon is increased. From FIG. 21, it can be understood that $V_{CE}$(sat), $J_{CES}$, and $E_{OFF}$(sat) can be made lower if the thickness of doped polysilicon is increased. From FIG. 22, it can be understood that the characteristic of the IGBT at the time of short circuit is also improved if the thickness of doped polysilicon is increased. These results mean that if the thickness of doped polysilicon is larger, the gettering effect can be improved to extend the carrier lifetime. If the layer thickness of doped polysilicon is equal to or larger than 500 [nm], good characteristics can be obtained and the stability in film thickness control in film forming is high.

Figure 23:
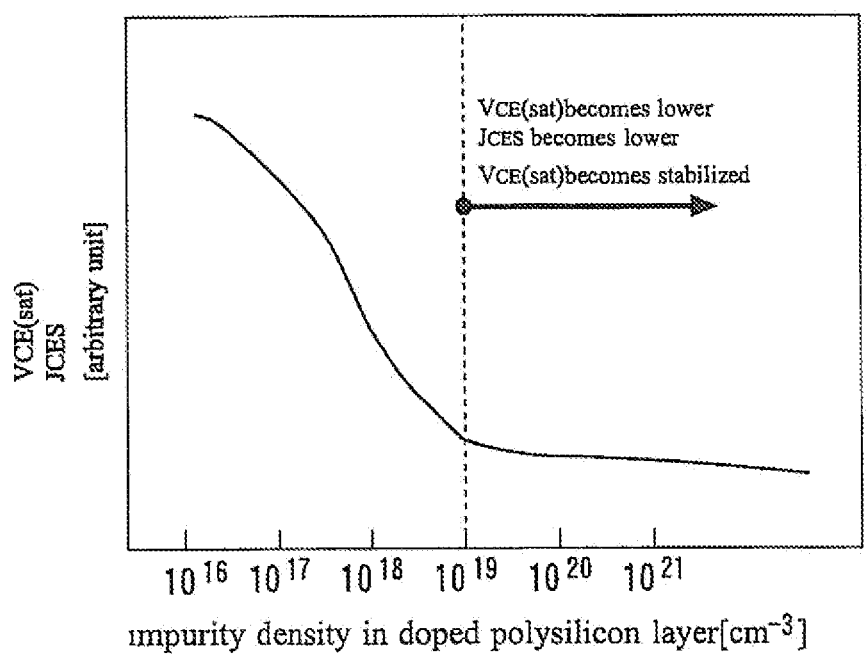
FIG. 23 is a graph showing dependences of on voltage ($V_{CE}$(sat)) and main junction leak current ($J_{CES}$) on impurity density of phosphorous doped polisilicon.

FIG. 23 is a graph showing impurity density dependences of $V_{CE}$(sat) and $J_{CES}$. This graph was prepared by forming 500 [nm] doped polysilicon for a semiconductor device in the 4500 V withstand voltage class. From FIG. 23, it can be understood that $V_{CE}$(sat) and $J_{CES}$ can be made lower if the impurity density in the doped polysilicon is set equal to or higher than $1 \times 10^{19}$ [cm⁻³].

Figure 24:
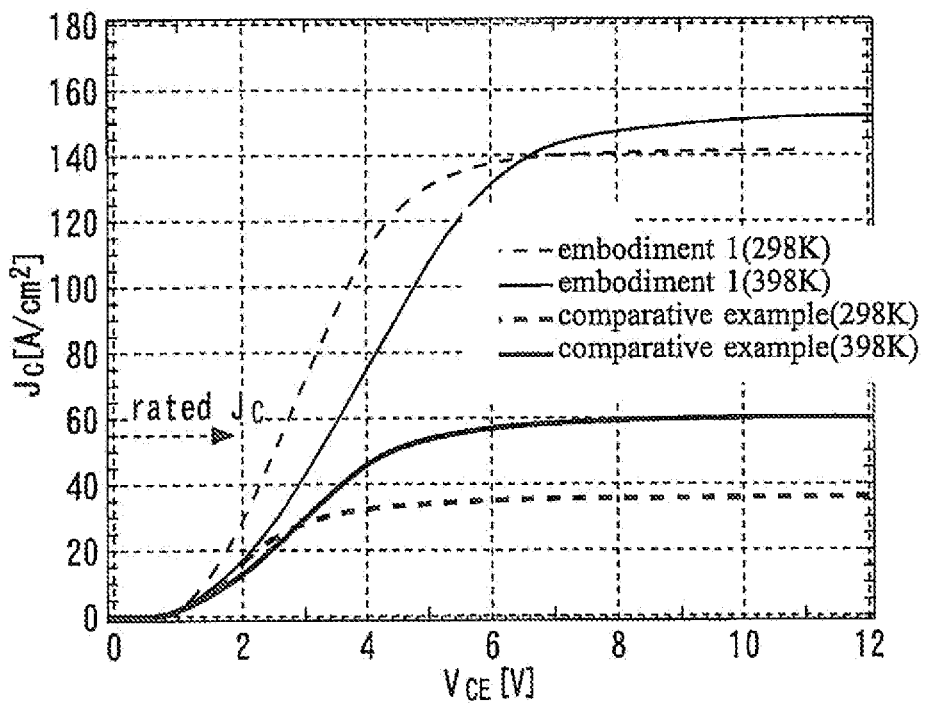
FIG. 24 is a graph in which a comparison is made between output characteristics of the semiconductor device manufactured by the semiconductor device manufacturing method according to Embodiment 1 of the present invention and output characteristics of the semiconductor device in the comparative example.

FIG. 24 is a graph in which a comparison is made between output characteristics of the IGBT manufactured by the semiconductor device manufacturing method according to Embodiment 1 of the present invention and output characteristics of the IGBT in the comparative example. For this comparison, semiconductor devices in the 4500 V withstand voltage class were evaluated. The lifetime of carriers in the N⁻ drift layer in the comparative example is shorter than that of carriers in the N⁻ drift layer of the present invention. The waveform in the output characteristic in the comparative example is lowered and the saturated value of the current density (Jc) is low. That is, the MOS transistor characteristic of the IGBT is degraded. From FIG. 24, it can be understood that the lifetime of carriers in the N⁻ drift layer largely influences the output characteristic, and that the output characteristic can be largely improved by the semiconductor device manufacturing method according to Embodiment 1 of the present invention.

Figure 25:
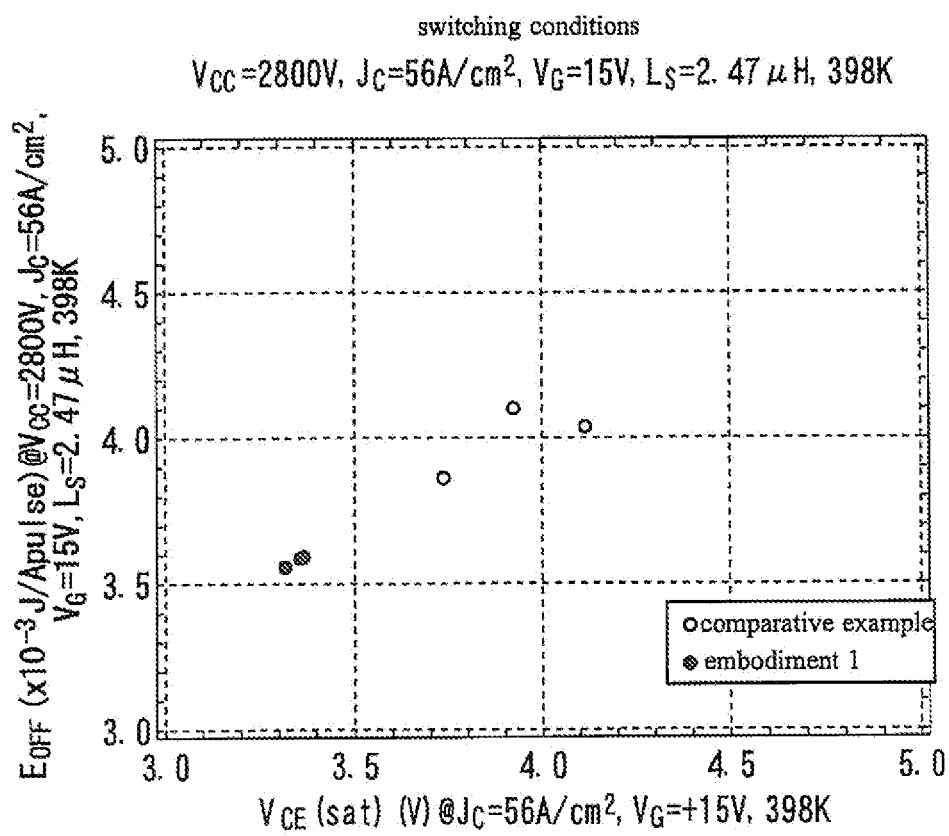
FIG. 25 is a graph showing trade-off characteristic between on voltage ($V_{CE}$(sat)) and loss at the time of turnoff ($E_{OFF}$).

FIG. 25 is a graph showing trade-off characteristic between $V_{CE}$(sat) and $E_{OFF}$(sat) as an indicator for the basic performance of the IGBT. $V_{CE}$(sat) is the $V_{CE}$ value at the rated current density in FIG. 24 ("ratedJc" in FIG. 24). The withstand voltage class of the evaluated IGBT is 4500 V. From FIG. 25, it can be understood that the trade-off characteristic can be largely improved in the IGBT of the present invention having a longer carrier lifetime in comparison with the comparative example IGBT having a shorter carrier lifetime.

Figure 26:
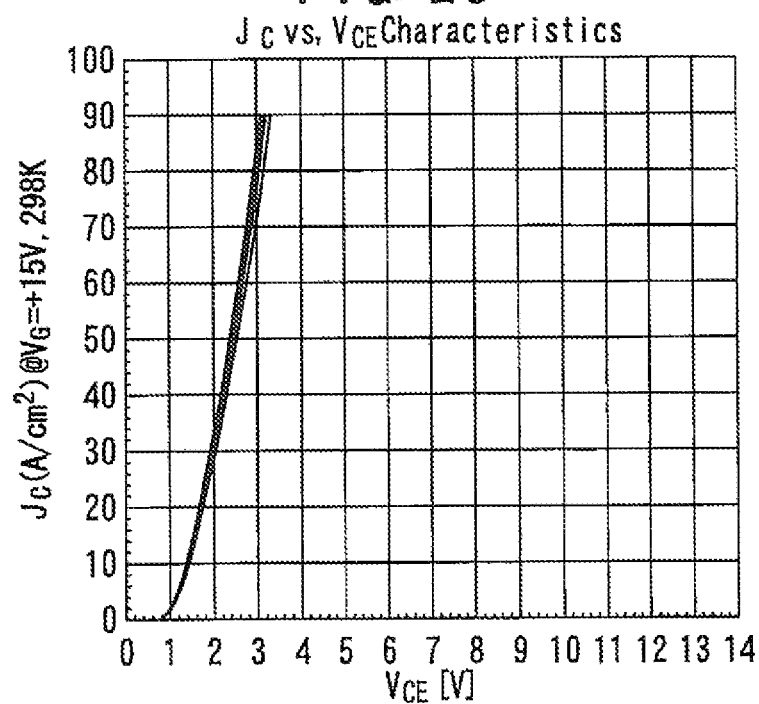
FIG. 26 shows $J_C$ vs. $V_{CE}$ characteristics of a plurality of semiconductor devices manufactured by the semiconductor device manufacturing method according to Embodiment 1 of the present invention.
Figure 27:
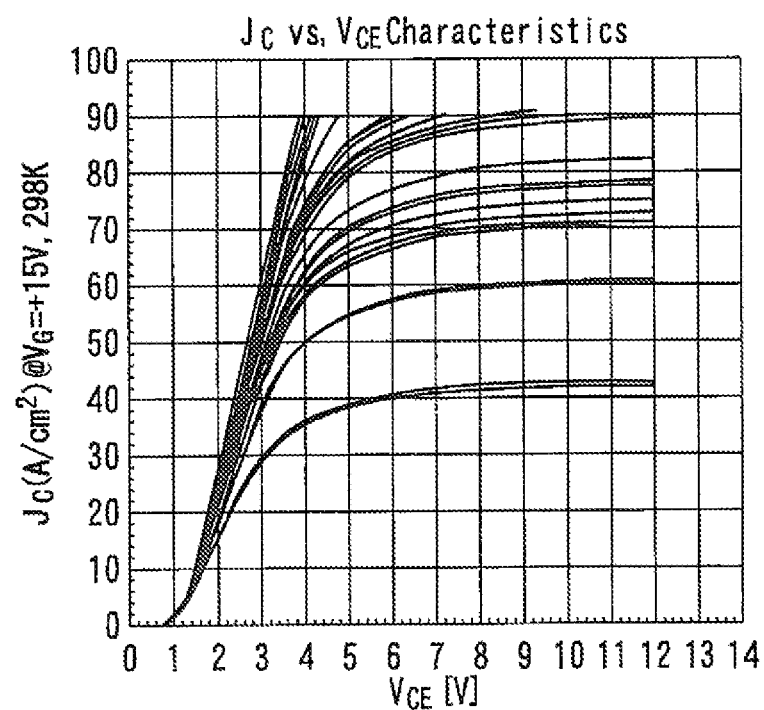
FIG. 27 shows $J_C$ vs. $V_{CE}$ characteristics of a plurality of semiconductor devices manufactured by the semiconductor device manufacturing method in the comparative example.

FIG. 26 is a graph of output characteristics ($J_C$ vs. $V_{CE}$ characteristics) of a plurality of IGBTs manufactured by the semiconductor device manufacturing method according to Embodiment 1 of the present invention. The plurality of IGBTs were made in one wafer surface. FIG. 27 is a graph of output characteristics of a plurality of IGBTs manufactured by the IGBT manufacturing method in the comparative example. It is apparent that the IGBTs manufactured by the semiconductor device manufacturing method according to Embodiment 1 of the present invention were improved with respect to variations in output characteristics and stabilized in characteristics.

FIG. 28 is a graph of $J_{CES}$-$V_{CES}$ characteristics of a plurality of IGBTs manufactured by the semiconductor device manufacturing method according to Embodiment 1 of the present invention. The plurality of IGBTs were made in one wafer surface. FIG. 29 is a graph of $J_{CES}$-$V_{CES}$ characteristics of a plurality of IGBTs manufactured by the semiconductor device manufacturing method in the comparative example. From comparison between FIGS. 28 and 29, it can be understood that $J_{CES}$ can be reduced by one order of magnitude from that in the comparative example by using the semiconductor device manufacturing method according to Embodiment 1 of the present invention, and that in-chip variations can also be reduced. That is, the characteristics of the IGBT are stabilized by the effect of the present invention.

FIG. 30 is a table showing the correspondence between electrical characteristics of IGBTs in a 6500 V withstand voltage class and manufacturing methods. Additional comparative example in FIG. 30 designates a structure obtained by forming doped polysilicon on the lower surface of the substrate and executing an annealing step after forming the structure shown in FIG. 3. That is, the additional comparative example designates a semiconductor device manufactured by executing the gettering layer forming step and the annealing step before the completion of the "manufacturing step". From FIG. 30, it can be understood that the characteristic improvement effect is improved in the case where the gettering layer forming step and the annealing step are executed after execution of the manufacturing step as in the semiconductor device manufacturing apparatus according to Embodiment 1 of the present invention. In other words, it is preferable to execute the gettering layer forming step and the annealing step before forming of the contact hole.

Figure 31:
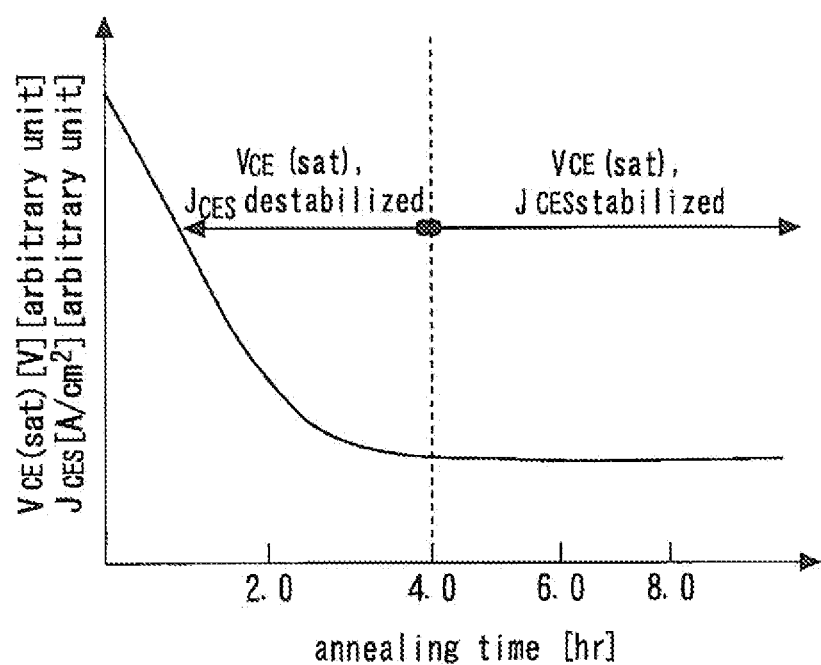
FIG. 31 is a graph showing an annealing time dependence of $V_{CE}$(sat) and $J_{CES}$ with respect to the annealing step after the formation of polysilicon doped with phosphorous.

FIG. 31 is a graph showing an annealing time dependence of $V_{CE}$(sat) and $J_{CES}$ with respect to the annealing step. The annealing step was executed by maintaining the substrate temperature at a point in the range from 600 to 700[° C.] in a nitrogen atmosphere. From FIG. 31, $V_{CE}$(sat) and $J_{CES}$ are sufficiently reduced and stabilized after an annealing time of four hours or longer. That is, it is preferable to maintain the substrate temperature at a point in the range from 600 to 700[° C.] in a nitrogen atmosphere for four hours or longer in the annealing step.

In a case where a wafer formed by the CZ method is used, there is a problem of an increased cost because the N⁻ drift layer is ordinarily formed by epitaxial growth. For example, an N⁻ drift layer of 50 to 60 [nm] is formed with respect to the 600 V class, and N⁻ drift layer of about 500 to 600 [nm] is formed with respect to the 6500 V class. Therefore, the cost of a high-withstand-voltage semiconductor device requiring forming the N⁻ drift layer thick is high.

It is, therefore, preferable to use a substrate formed by the FZ method. The cost of a substrate formed by the FZ method is not changed with respect to withstand voltage classes because its thickness is set to a desired value by reducing the thickness of the N⁻ drift layer. However, a substrate formed by the FZ method is lower in self-gettering ability (IG: Intrinsic Gettering) and also lower in well-known extrinsic gettering (EG) effect. In a case where a substrate formed by the FZ method is used for a bipolar semiconductor device such as an IGBT or a diode, therefore, the lifetime of carriers in the N⁻ drift layer is reduced. To avoid this, a metal impurity and other things in the N⁻ drift layer are captured by the gettering layer, as described above in the description of the semiconductor device according to Embodiment 1 of the present invention. As a result, a semiconductor device can be manufactured on a substrate formed at a low cost by the FZ method, the carrier lifetime of the N⁻ drift layer can be controlled to be extended, and the loss in the on state can be reduced. This effect is not limited to the substrate formed by the FZ method. Similar effect can also be achieved, for example, in the case of using an epi wafer.

In the semiconductor device manufacturing method according to Embodiment 1 of the present invention, the gettering layer forming step and the annealing step are executed after the manufacturing step in which the emitter, base and trench constituting the surface structure of an IGBT are formed is executed and before forming contact holes, thereby extending the carrier lifetime of in the N⁻ drift layer. Various modifications can be made within such a scope as not to depart from this feature. For example, the removal step to remove the doped polysilicon 60 and the gettering layer 64 may be executed immediately after execution of the gettering layer forming step and the annealing step.

While the substrate according to Embodiment 1 of the present invention is formed of silicon, the substrate may be alternatively formed of a wide-bandgap semiconductor having a bandgap larger than that of silicon. The wide-bandgap semiconductor is, for example, silicon carbide, a gallium nitride-based material or diamond. The conduction types of portions of the semiconductor element may be reversed as desired.

Embodiment 2

Figure 32:
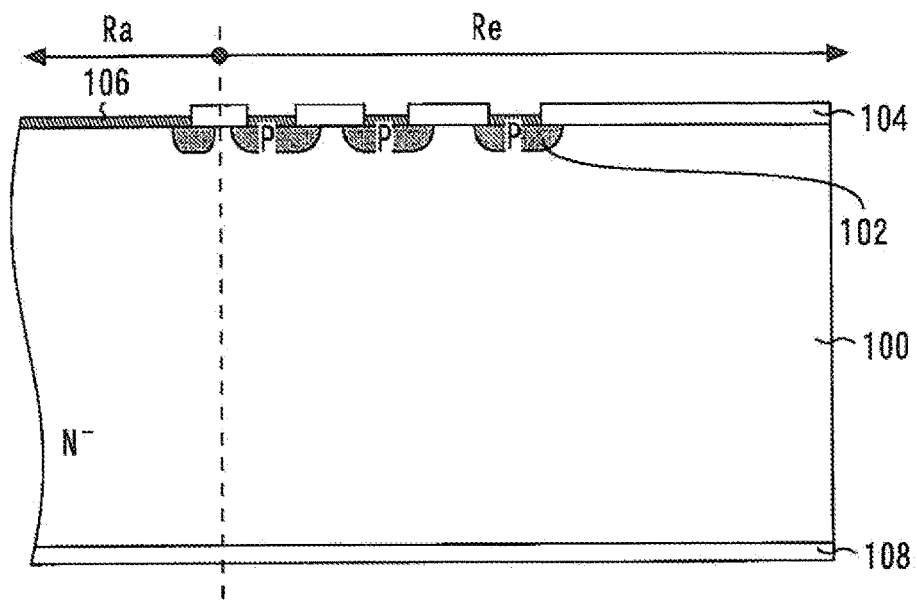
FIG. 32 is a sectional view showing a state where a diffusion layer is formed in a substrate of the diode.

A semiconductor device manufacturing method according to Embodiment 2 of the present invention is an application of the semiconductor device manufacturing method according to Embodiment 1 to a diode. The semiconductor device manufacturing method according to Embodiment 2 of the present invention will be described below. FIG. 32 is a sectional view showing a state where a diffusion layer is formed in a substrate. FIG. 32 illustrates an active region Ra and an edge termination region Re formed so as to surround the active region Ra. A substrate having only an N⁻ drift layer 100 formed therein is prepared. An impurity density is set in the substrate according to a withstand voltage class. For example, if the withstand voltage class is of a voltage in a range from 600 to 6500[V], the impurity density in the substrate is in a range from $1.0 \times 10^{12}$ to $1.0 \times 10^{15}$ [cm⁻³].

A plurality of P layers 102 are formed in the edge termination region Re. The P layers 102 are formed by performing ion implantation using, as a mask, insulating films 104 and 106 formed in advance and by thereafter performing annealing. The surface density in the P layers 102 is, for example, in a range from $1.0 \times 10^{16}$ to $1.0 \times 10^{18}$ [cm⁻³]. An oxide film 108 not needed is also formed in a lower surface of the substrate.

Figure 33:
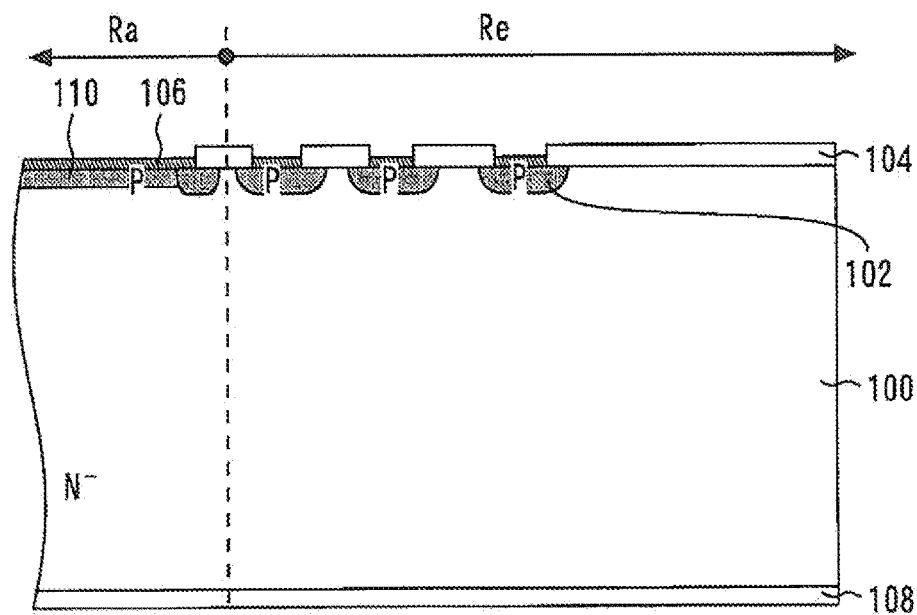
FIG. 33 is a sectional view showing a state where a P anode layer is formed in the active region of the diode.

The process advances to a subsequent step. FIG. 33 is a sectional view showing a state where a P anode layer 110 is formed in the active region. The P anode layer 110 is formed by performing ion implantation and annealing on the active region Ra. The surface density in the P anode layer 110 is, for example, in a range from $1.0 \times 10^{16}$ to $1.0 \times 10^{18}$ [cm⁻³]. In Embodiment 2 of the present invention, the "first diffusion layer" formed on the upper surface side of the substrate is the P layer 102 and the P anode layer 110.

Figure 34:
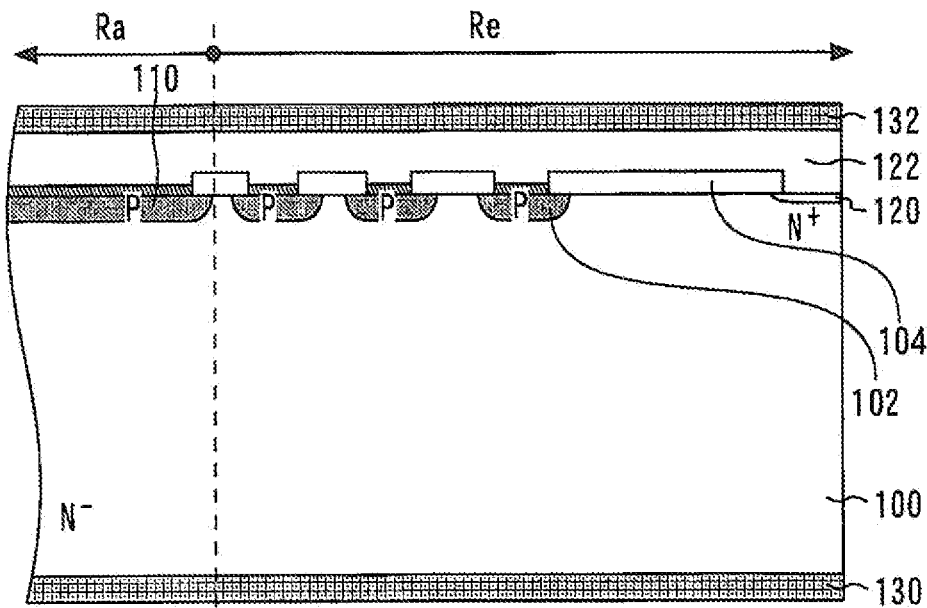
FIG. 34 is a sectional view showing a state where an N+ layer, TEOS film and doped polysilicon of diode are formed.

The process advances to a subsequent step. FIG. 34 is a sectional view showing a state where an N⁺ layer, TEOS film and doped polysilicon are formed. An N⁺ layer 120 is formed in an end portion of the edge termination region Re on the upper surface side of the substrate. The surface density in the N⁺ layer 120 is, for example, in a range from $1.0 \times 10^{18}$ to $1.0 \times 10^{21}$ [cm⁻³]. The depth of the N⁺ layer 120 is, for example, in a range from 0.2 to 10.0 [μm]. A TEOS film 122 is subsequently formed on the upper surface of the substrate. The TEOS film 122 may have a structure such as that of the oxide film 40 and the TEOS film 41 in FIG. 7. The oxide film 108 in the lower surface of the substrate is thereafter removed. Doped polysilicon 130 doped with an impurity is formed so as to contact the N⁻ drift layer 100 exposed at the lower surface of the substrate. Simultaneously, doped polysilicon 132 is also formed on the upper surface of the substrate.

Figure 35:
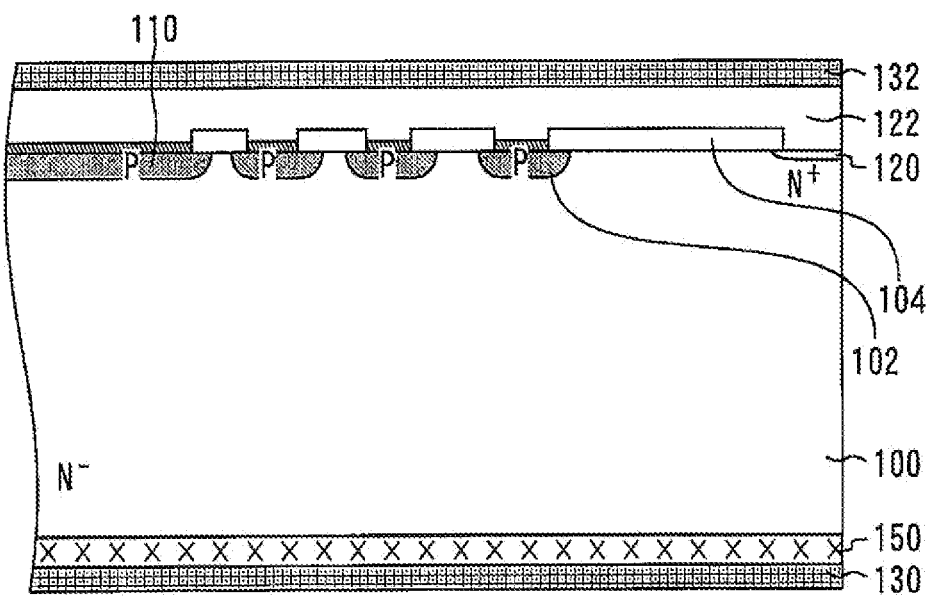
FIG. 35 is a sectional view showing a state where a gettering layer of diode is formed.

The process advances to a subsequent step. FIG. 35 is a sectional view showing a state where a gettering layer is formed. The substrate is heated to diffuse the impurity in the doped polysilicon 130 to the lower surface side of the N⁻ drift layer 100, thereby forming a gettering layer 150 having crystal defects and the impurity on the lower surface side of the N⁻ drift layer 100. This step is the same as the preprocessing annealing step in Embodiment 1. Thereafter, the annealing step is executed to capture by the gettering layer 150 the metal impurity, contaminant atoms and damage in the N⁻ drift layer 100.

Figure 36:
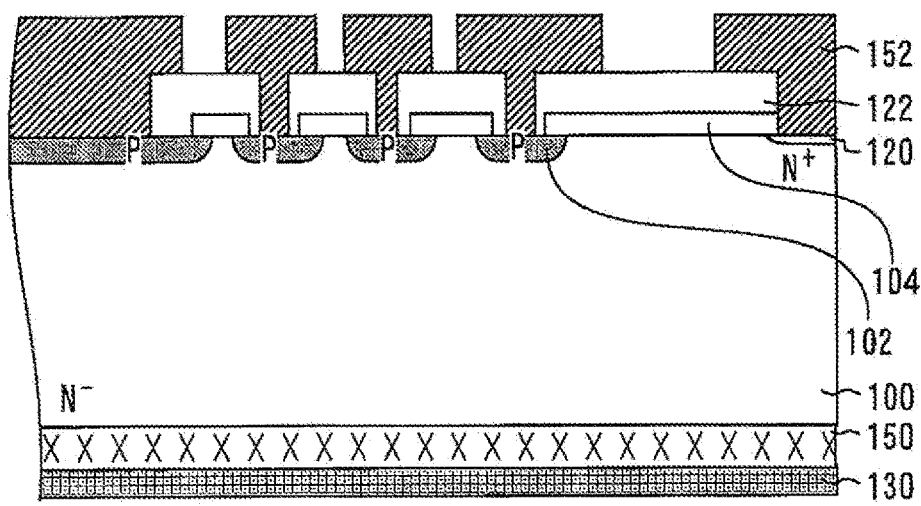
FIG. 36 is a sectional view showing a state where metal wiring of diode is formed.

The process advances to a subsequent step. FIG. 36 is a sectional view showing a state where metal wiring is formed. First, a contact hole through which the P layer 102 and the P anode layer 110 is formed on the substrate supper surface. That is, the TEOS film 122 is worked, as shown in FIG. 36. Thereafter, aluminum wiring 152 to which approximately 1 to 3% of Si is added is formed by sputtering.

Figure 37:
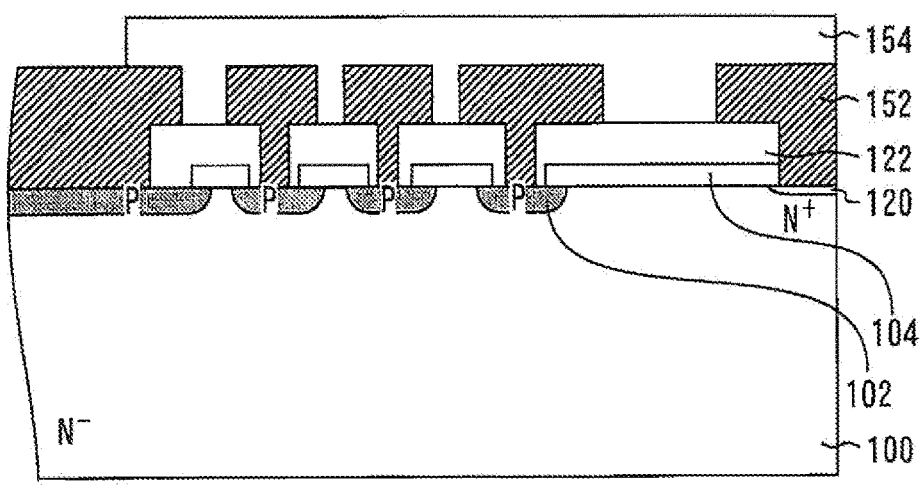
FIG. 37 is a sectional view showing a state where a passivation film of diode is formed while the gettering layer and the doped polysilicon are removed.

The process advances to a subsequent step. FIG. 37 is a sectional view showing a state where a passivation film is formed while the gettering layer and the doped polysilicon are removed. A passivation film 154 is formed on the upper surface of the substrate. The gettering layer 150 and the doped polysilicon 130 formed on the lower surface side of the substrate are removed by polishing or etching. Processing details of this step are the same as those of the removal step in Embodiment 1. By the removal step, the thickness of the substrate (N⁻ drift layer) is set to a value according to the withstand voltage class of the semiconductor device.

Figure 38:
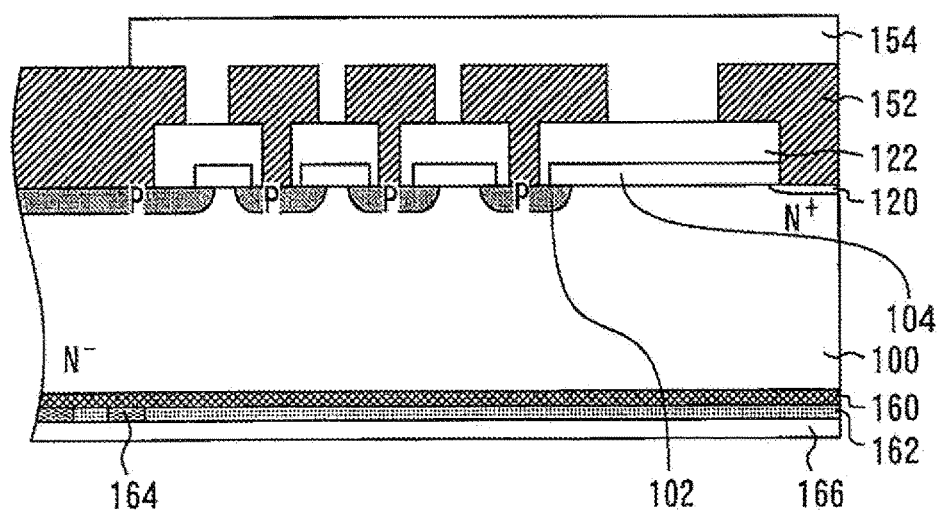
FIG. 38 is a sectional view showing a state where a diffusion layer and an electrode of diode are formed at the lower surface of the N− drift layer.

The process advances to a subsequent step. FIG. 38 is a sectional view showing a state where a diffusion layer and an electrode are formed at the lower surface of the N⁻ drift layer. An N layer 160 is formed on the lower surface side of the N⁻ drift layer 100. The surface density in the N layer 160 (the density in a lower surface portion of the N layer 160) is, for example, in a range from $1.0\times10^{15}$ to $1.0\times10^{18}$ [cm⁻³]. A P layer 162 is formed on a lower surface of the N layer 160. The surface density in the P layer 162 (the density in a lower surface portion of the P layer 162) is, for example, in a range from $1.0\times10^{16}$ to $1.0\times10^{20}$ [cm⁻³].

An N⁺ layer 164 is formed in a portion of the P layer 162. The surface density in the N⁺ layer 164 is, for example, in a range from $1.0\times10^{19}$ to $1.0\times10^{21}$ [cm⁻³]. The N layer 160, the P layer 162 and the N⁺ layer 164 are diffusion layers formed by ion implantation and annealing. An electrode 166 is finally formed on the substrate lower surface. In Embodiment 2 of the present invention, a "second diffusion layer" formed on the lower surface side of the substrate is the N layer 160, the P layer 162 and the N⁺ layer 164. The meaning of forming these layers is disclosed in Japanese Patent Laid-Open Nos. 2010-283131 and 2012-9811.

Figure 39:
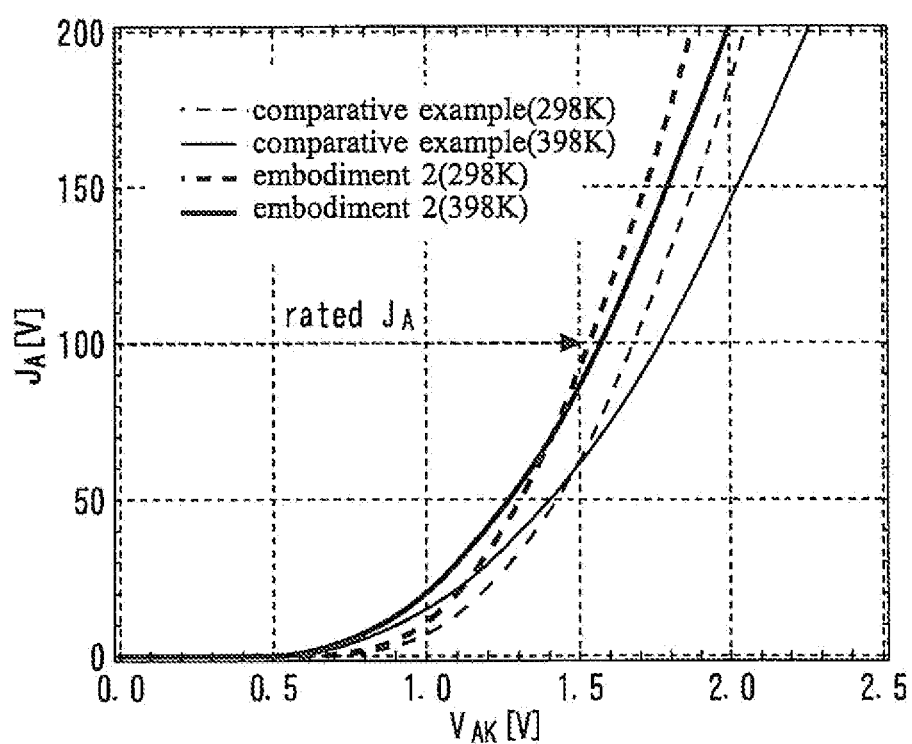
FIG. 39 is a graph in which output characteristics of the diode manufactured by the semiconductor device manufacturing method according to Embodiment 2 of the present invention and output characteristics of a diode in a comparative example are compared.

The semiconductor device manufacturing method according to Embodiment 2 of the present invention enables extending the carrier lifetime of the N⁻ drift layer and, hence, improving characteristics of the diode. FIG. 39 is a graph in which output characteristics of the diode manufactured by the semiconductor device manufacturing method according to Embodiment 2 of the present invention and output characteristics of a diode in a comparative example are compared. The withstand voltage class of the evaluated diodes is of 3300 V. With respect to the diode manufactured by the semiconductor device manufacturing method according to Embodiment 2 of the present invention, either of measurement at 298[K] and measurement at 398[K] ended in a better result.

Figure 40:
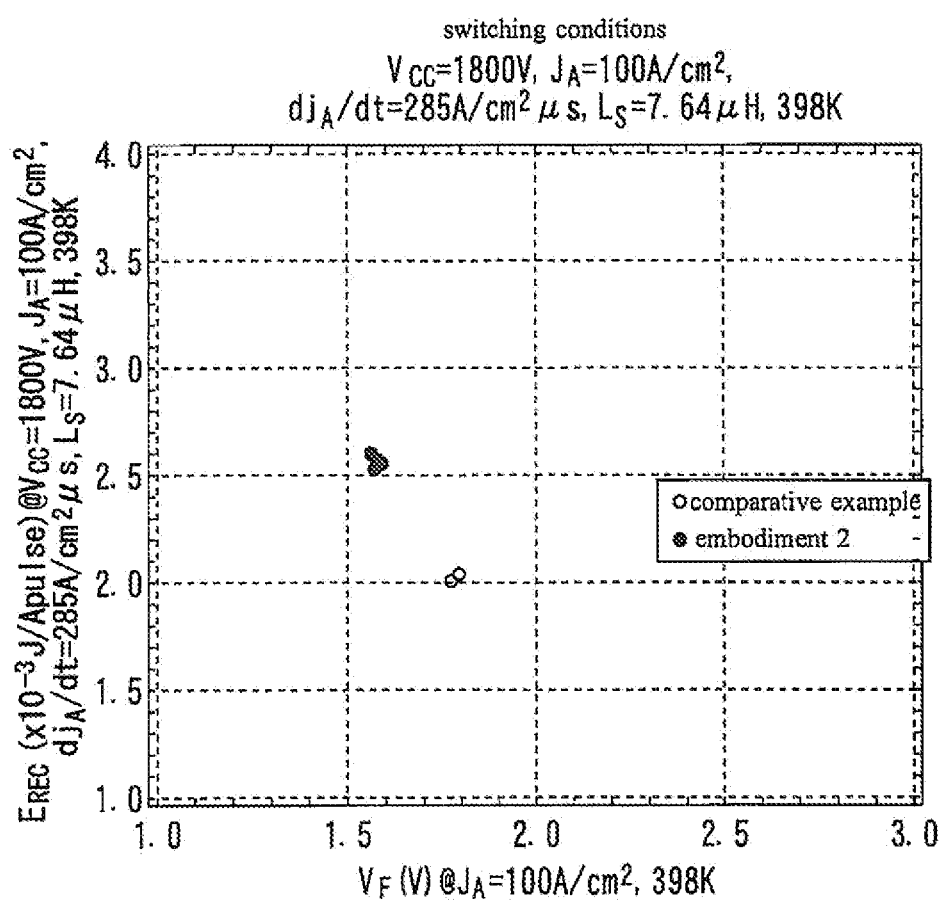
FIG. 40 is a graph in which a comparison is made between a trade-off characteristic with respect to the on voltage (VF) and a loss ($E_{REC}$) at the time of turnoff of the diode manufactured by the semiconductor device manufacturing method according to Embodiment 2 of the present invention and a corresponding characteristic of the diode in the comparative example.

FIG. 40 is a graph in which a comparison is made between a trade-off characteristic with respect to the on voltage ($V_F$) and a loss ($E_{REC}$) at the time of turnoff of the diode manufactured by the semiconductor device manufacturing method according to Embodiment 2 of the present invention and a corresponding characteristic of the diode in the comparative example. The on voltage ($V_F$) is shown by $V_{AK}$ corresponding to rated $J_A$ of $J_A$ in FIG. 39. When the carrier lifetime of the N⁻ drift layer is long, $V_F$ is low and $E_{REC}$ is high. When the carrier lifetime of the N⁻ drift layer is short, $V_F$ is high and $E_{REC}$ is low. As can be understood from FIG. 40, the diode according to Embodiment 2 of the present invention has lower $V_F$ and higher $E_{REC}$ in comparison with the comparative example. Thus, the diode according to Embodiment 2 of the present invention is capable of increasing the carrier lifetime of the N⁻ drift layer and improving the diode characteristics in comparison with the diode in the comparative example.

Also in the semiconductor device manufacturing method according to Embodiment 2 of the present invention, it is preferable to perform the gettering layer forming step and the annealing step after the manufacturing step to capture by the gettering layer the metal impurity, contaminant atoms and damage in the N⁻ drift layer, as in the case of Embodiment 1. The manufacturing step in the case of manufacturing the diode includes the step to form the P anode layer 110 constituting the surface structure of the diode, and the insulating films 104 and 106. The semiconductor device and the method of manufacturing the semiconductor device according to Embodiment 2 of the present invention can be modified at least to the same extent as those in Embodiment 1.

Embodiment 3

Figure 41:
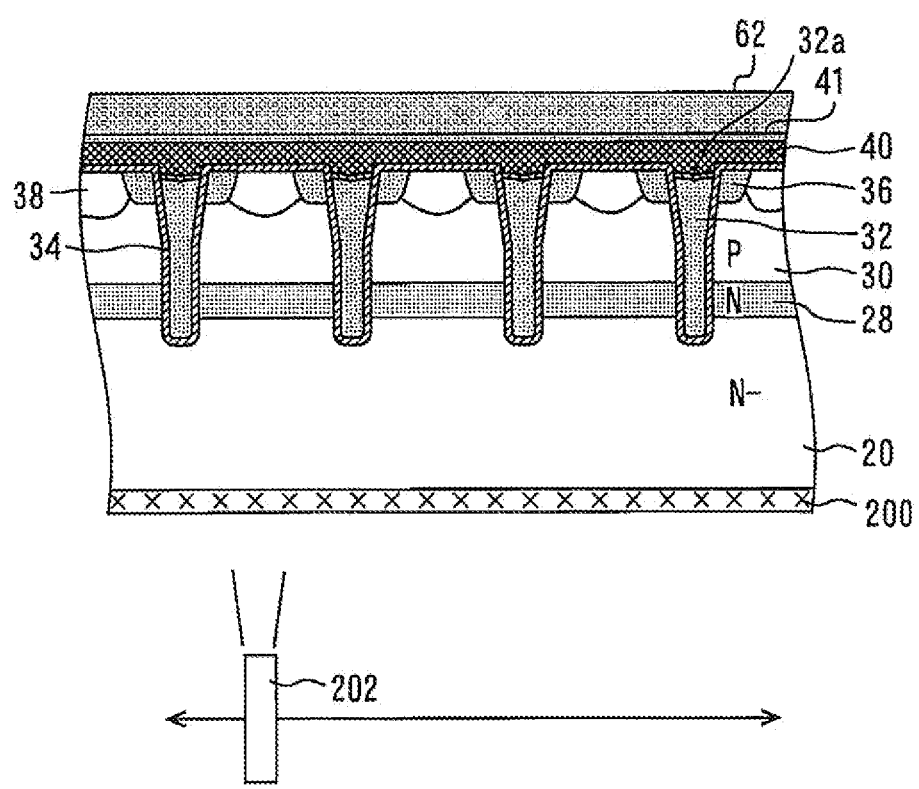
FIG. 41 is a sectional view of IGBT showing the gettering layer forming step in the semiconductor device manufacturing method according to Embodiment 3 of the present invention.

A semiconductor device manufacturing method according to Embodiment 3 of the present invention is defined by changing the details of processing in the gettering layer forming step in the semiconductor device manufacturing method according to Embodiment 1. FIG. 41 is a sectional view showing the gettering layer forming step in the semiconductor device manufacturing method according to Embodiment 3 of the present invention. In this gettering layer forming step, the N⁻ drift layer 20 exposed at the lower surface of the substrate is heated to form a gettering layer 200 having crystal defects on the lower surface side of the N⁻ drift layer 20. It is preferable to use, for heating of the N⁻ drift layer 20, a laser annealing technique using laser light emitted from a laser light source 202. Preferably, the power of the laser light is equal to or higher than 4.0 [J/cm²]. The wavelength of the laser light is, for example, in a range from 500 to 1000 [nm].

Figures 42, 43:
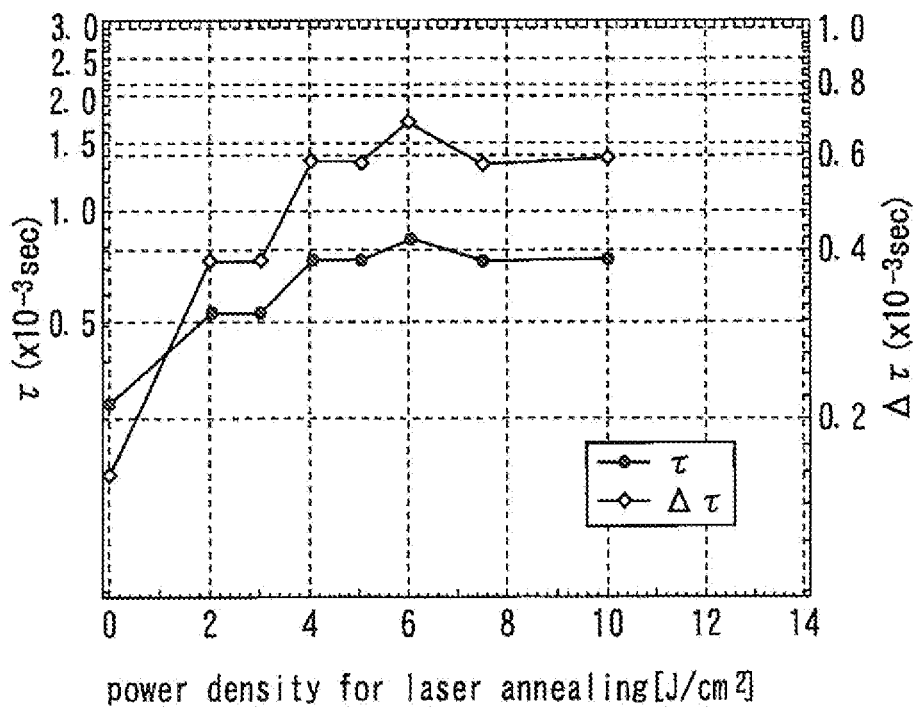
FIG. 42 is a table showing changes in carrier lifetime with respect to the existence/nonexistence of the gettering layer forming step.
FIG. 43 is a graph showing the relationship between the power density of laser light at the time of forming the gettering layer and the carrier lifetime (τ) of the N− drift layer.

The semiconductor device manufacturing method according to Embodiment 3 of the present invention ensures that the gettering layer 200 can easily be formed only by heating the lower surface of the N⁻ drift layer 20. FIG. 42 is a table showing changes in carrier lifetime with respect to the existence/nonexistence of the gettering layer forming step. The carrier lifetimes in Embodiment 3 and the comparative example are substantially equal to each other immediately after "etching on the wafer lower surface". However, the carrier lifetime after the annealing step in Embodiment 3 is increased relative to that in the comparative example. The reason that the carrier lifetime can be increased is that the gettering layer 200 functions as a getter site.

FIG. 43 is a graph showing the relationship between the power density of laser light at the time of forming the gettering layer and the carrier lifetime (t) of the N⁻ drift layer 20. Δτ in FIG. 43 represents the amount of change in t between the value before execution of laser annealing and the annealing step and the value after execution of laser annealing and the annealing step. From FIG. 43, it can be understood that the carrier lifetime improvement effect by laser annealing can be obtained with stability if the power density for laser annealing is set equal to or higher than 4 [Jcm²].

The semiconductor device and the method of manufacturing the semiconductor device according to Embodiment 3 of the present invention can be modified at least to the same extent as those in Embodiment 1. Also, a desired combination of the features of the semiconductor devices in the embodiments may be made

DESCRIPTION OF SYMBOLS

10 semiconductor device, 12 active region, 14 edge termination region, 20 N-drift layer, 22 buffer layer, 24 collector layer, 26 electrode, 28 N layer, 30 base layer, 31 Oxide film, 32 polysilicon, 32a oxide film, 34 gate oxide film, 36 N+ emitter layer, 37 trenches, 38 P+ layer, 39 silicide film, 40 oxide film, 41 TEOS film, 42 barrier metal, 44 metal wiring, 60,62 doped polysilicon, 64 gettering layer, 100 N− drift layer, 102 P layers, 104,106,108 insulating films, 110 anode layer, 120 N+ layer, 122 TEOS film, 130,132 doped polysilicon, 150 gettring layer, 152 aluminum wiring, 154 passivation film, 166 electrode, 200 gettering layer, 202 laser light source

The invention claimed is:

1. A semiconductor device comprising:
   a substrate having a drift layer;
   metal wiring formed on an upper surface of the substrate; and
   an electrode formed on a back surface of the substrate,
   wherein the lifetime of carriers in the drift layer satisfies the following expression 1:

[Expression 1]

$$\tau \geq 1.5 \times 10^{-5} \exp(5.4 \times 10^3 t_{N-}) \qquad \text{expression 1}$$

$\tau$: the lifetime of carriers in the drift layer [sec]
   $t_{N-}$: the layer thickness of the drift layer [m].

2. The semiconductor device according to claim 1, wherein the substrate is formed of a wide-bandgap semiconductor.

3. The semiconductor device according to claim 2, wherein the wide-bandgap semiconductor is silicon carbide, a gallium nitride-based material or diamond.

* * * * *